United States Patent
Wu

(10) Patent No.: US 8,779,850 B2
(45) Date of Patent: Jul. 15, 2014

(54) BOOTSTRAP CIRCUIT

(71) Applicant: Orise Technology Co., Ltd., Hsinchu (TW)

(72) Inventor: Che-Wei Wu, Keelung (TW)

(73) Assignee: Orise Technology Co., Ltd., Hsinchu (TW)

( * ) Notice: Subject to any disclaimer, the term of this patent is extended or adjusted under 35 U.S.C. 154(b) by 0 days.

(21) Appl. No.: 13/903,055

(22) Filed: May 28, 2013

(65) Prior Publication Data
US 2013/0321056 A1     Dec. 5, 2013

(30) Foreign Application Priority Data
May 31, 2012  (TW) ............................. 101119514 A

(51) Int. Cl.
*H03K 17/16* (2006.01)
*H03K 3/013* (2006.01)
*H03K 19/017* (2006.01)

(52) U.S. Cl.
CPC .......... *H03K 3/013* (2013.01); *H03K 19/01735* (2013.01)
USPC ....................................................... 327/589

(58) Field of Classification Search
CPC ........................... H02M 3/07; H03K 19/01735
USPC .......................................... 327/390, 536, 589
See application file for complete search history.

(56) References Cited

U.S. PATENT DOCUMENTS

| | | | |
|---|---|---|---|
| 5,729,165 A * | 3/1998 | Lou et al. ...................... | 327/112 |
| 6,242,973 B1 * | 6/2001 | Kong et al. ................... | 327/589 |
| 7,889,832 B2 | 2/2011 | Otose et al. | |
| 7,973,564 B1 * | 7/2011 | Chuang et al. ................. | 326/87 |
| 2008/0191798 A1 | 8/2008 | Chou et al. | |
| 2008/0218141 A1 | 9/2008 | Lu et al. | |
| 2008/0309400 A1 | 12/2008 | van der Wagt | |
| 2011/0050317 A1 | 3/2011 | Nonaka | |

OTHER PUBLICATIONS

Senderowicz, et al, "Low-Voltage Double-Sampled $\Sigma\Delta$ Converters", Dec. 1997, pp. 1907-1919, vol. 32, No. 12, IEEE Journal of Solid-State Circuits.

* cited by examiner

*Primary Examiner* — Jeffrey Zweizig
(74) *Attorney, Agent, or Firm* — WPAT, PC; Justin King

(57) ABSTRACT

A bootstrap circuit includes an input terminal, an inverting input terminal, an output terminal, an inverting output terminal, a first sub-bootstrap circuit, a second sub-bootstrap circuit, and a charging path providing circuit. The first sub-bootstrap circuit includes a first bootstrap capacitor, a first charging path, a first discharging path, and a first high voltage providing path. The charging path providing circuit includes a third charging path. In response to a high voltage level inputted into the input terminal, the first charging path and the third charging path are turned on, the first bootstrap capacitor is charged to a capacitor voltage, and the first discharging path is turned on to discharge the output terminal. In response to a low voltage level inputted into the input terminal, a first superimposed voltage including the high voltage level and the capacitor voltage is provided to the output terminal.

23 Claims, 13 Drawing Sheets

BOOTSTRAP CIRCUIT

This application claims the benefit of Taiwan Patent Application No. 101119514, filed May 31, 2012, the subject matter of which is incorporated herein by reference.

FIELD OF THE INVENTION

The present invention relates to a bootstrap circuit, and more particularly to a bootstrap circuit with multiple charging paths.

BACKGROUND OF THE INVENTION

A voltage multiplier or a voltage doubler is used for producing an output voltage Vout which is an integer times of the high voltage level of a clock signal. A bootstrap circuit is a type of voltage multiplier with high input impedance.

FIG. 1A schematically illustrates a conventional bootstrap circuit, in which the input terminal is at a high voltage level. FIG. 1B schematically illustrates a conventional bootstrap circuit, in which the input terminal is at a low voltage level.

As shown in FIGS. 1A and 1B, the conventional bootstrap circuit 10 includes a first P-type transistor P1, a first N-type transistor N1, a second P-type transistor P2, a first inverter INV1, and a first bootstrap capacitor $C_{B1}$.

As shown in FIG. 1A, the gate terminal of the first P-type transistor P1 and the gate terminal of the first N-type transistor N1 are both electrically connected with an input terminal Sin of the bootstrap circuit 10. Consequently, the on/off statuses of the first P-type transistor P1 and the first N-type transistor N1 are determined according to the voltage at the input terminal Sin of the bootstrap circuit 10.

Moreover, the input terminal of the first inverter INV1 is also electrically connected with the input terminal Sin of the bootstrap circuit 10. The output terminal of the first inverter INV1 is electrically connected with a first end of the first bootstrap capacitor $C_{B1}$ through a first node s1. A second end of the first bootstrap capacitor $C_{B1}$ is electrically connected with the drain terminal of the second P-type transistor P2 and the source terminal of the first P-type transistor P1 through a second node s2.

Moreover, the drain terminal of the first P-type transistor P1, the drain terminal of the first N-type transistor N1 and the gate terminal of the second P-type transistor P2 are collectively connected with the output terminal Sout of the bootstrap circuit 10. The source terminal of the second P-type transistor P2 is electrically connected with a power voltage Vdd. The source terminal of the first N-type transistor N1 is electrically connected with a ground terminal. The voltage at the ground terminal is equal to a ground voltage (Vss=GND=0V).

As the clock signal CLK inputted into the input terminal Sin of the bootstrap circuit 10 is changed, the voltage at the output terminal Sout of the bootstrap circuit 10 is changed. The bootstrap circuit 10 of FIG. 1A and the bootstrap circuit 10 of FIG. 1B are substantially identical. However, the input voltage Vin of the clock signal CLK in the bootstrap circuit 10 of FIG. 1A is at the high voltage level (i.e. Vin=Vdd), but the input voltage Vin of the clock signal CLK in the bootstrap circuit 10 of FIG. 1B is at the low voltage level (i.e. Vin=0 volt). The operations of the transistors, capacitor, inverter and nodes included in the bootstrap circuit 10 as shown in FIGS. 1A and 1B will be illustrated in more details with reference to FIG. 1C.

FIG. 1C is a schematic timing waveform diagram illustrating associated voltage signals processed in the bootstrap circuit of FIGS. 1A and 1B. As shown in FIG. 1C, the clock signal CLK inputted into the input terminal of the bootstrap circuit has a low voltage level equal to the ground voltage (0 volt) and a high voltage level equal to the power voltage Vdd.

Since the clock signal CLK is inputted into the bootstrap circuit 10 through the input terminal Sin of the bootstrap circuit, the voltages at the gate terminal of the first P-type transistor P1, the gate terminal of the first N-type transistor N1 and the input terminal of the first inverter INV1, which are electrically connected with the input terminal Sin of the bootstrap circuit, are also changed with the voltage level change of the clock signal CLK. Consequently, the operations of the bootstrap circuit 10 are varied in response to the voltage level change of the clock signal CLK.

In FIG. 1C, the first waveform (i.e. the topmost waveform) denotes the change of the voltage Vin at the input terminal Sin of the bootstrap circuit, the second waveform (i.e. the waveform under the first waveform) denotes the change of the voltage Vout at the output terminal Sout of the bootstrap circuit, the third waveform (i.e. the waveform under the second waveform) denotes the change of the voltage Vs1 at the first node s1, and the fourth waveform (i.e. the bottommost waveform) denotes the change of the voltage Vs2 at the second node s2.

For example, the clock signal CLK inputted into the bootstrap circuit is initially at the low voltage level. The clock signal CLK is switched to be at the high voltage level during a first time period T1, and the clock signal CLK is switched to be at the low voltage level during a second time period T2. The operations of the conventional bootstrap circuit will be illustrated by referring to FIG. 1A and FIG. 1B and the first time period T1 and the second time period T2 of FIG. 1C.

Please refer to FIG. 1A and the first time period T1 of FIG. 1C. In a case that the clock signal CLK is at the high voltage level during the first time period T1, the voltage Vin at the input terminal Sin of the bootstrap circuit is also at the high voltage level. Since the voltage at the gate terminal of the first N-type transistor N1 is at the high voltage level, the first N-type transistor N1 is turned on. Since the voltage at the gate terminal of the first P-type transistor P1 is at the high voltage level, the first P-type transistor P1 is turned off.

As the first N-type transistor N1 is turned on, the output terminal Sout of the bootstrap circuit is connected with the ground terminal Vss through the first N-type transistor N1. Consequently, as shown in FIG. 1A, a current is generated from the output terminal Sout of the bootstrap circuit and flows to the ground terminal Vss through the first N-type transistor N1. Moreover, as shown in FIG. 1C, the voltage Vout at the output terminal Sout of the bootstrap circuit is maintained at the low voltage level (0 volt) during the first time period T1.

Since the gate terminal of the second P-type transistor P2 is electrically connected with the output terminal Sout of the bootstrap circuit, the voltage at the gate terminal of the second P-type transistor P2 is 0 volt. Under this circumstance, the second P-type transistor P2 is turned on. As the second P-type transistor P2 is turned on, the voltage at the drain terminal of the second P-type transistor P2 is equal to the power voltage Vdd. Consequently, as shown in FIG. 1C, the voltage at the second node s2 is maintained at the power voltage Vdd during the first time period T1.

On the other hand, in a case that the clock signal CLK is at the high voltage level, the voltage at the first node s1 (the output voltage of the first inverter INV1) is at the low voltage level. Consequently, as shown in the third waveform of FIG. 1C, the voltage at the first node s1 is 0 volt during the first time period T1.

From the above discussions, since the first and the second ends of the first bootstrap capacitor $C_{B1}$ are respectively connected with the first node s1 and the second node s2, the voltages at the first end of the first bootstrap capacitor $C_{B1}$ and the second end of the first bootstrap capacitor $C_{B1}$ are respectively equal to 0 volt and Vdd. Consequently, as shown in FIG. 1A, the power voltage generates a current, and the current flows through the second P-type transistor P2 to charge the first bootstrap capacitor $C_{B1}$.

The behaviors of the sub-bootstrap circuit 20 during the second time period T2 will be illustrated with reference to FIGS. 1B and 1C. Since the clock signal CLK is at the low voltage level during the second time period T2, the voltage at the first node s1 (the output voltage of the first inverter INV1) is at the high voltage level. Since the first bootstrap capacitor $C_{B1}$ is charged during the first time period T1, the voltage difference between the two ends of the first bootstrap capacitor $C_{B1}$ is equal to a capacitor voltage Vdd. Consequently, when the voltage at the first node s1 is increased to Vdd during the second time period T2, the voltage at the second node s2 is correspondingly increased to a first superimposed voltage, which is equal to 2×Vdd (i.e. Vdd+Vdd=2×Vdd).

On the other hand, in response to the low voltage level of the clock signal CLK, the first P-type transistor P1 is turned on, and the first N-type transistor N1 is turned off. When the first P-type transistor P1 is turned on, a current flows to the output terminal Sout of the bootstrap circuit 10 through the second node s2. Under this circumstance, the voltage at the output terminal Sout of the bootstrap circuit 10 is also 2×Vdd. Consequently, the output terminal Sout of the bootstrap circuit 10 is changed from 0 volt (during the first time period T1) to 2×Vdd (during the second time period T2).

Moreover, since the gate terminal of the second P-type transistor P2 is electrically connected with the output terminal Sout of the bootstrap circuit 10, the voltage at the gate terminal of the second P-type transistor P2 is also 2×Vdd. Consequently, the second P-type transistor P2 is turned off during the second time period T2.

The operations of the conventional bootstrap circuit 10 as mentioned above are in an ideal state. In practical applications, since the output terminal Sout of the bootstrap circuit 10 is connected with a load circuit, the load circuit generates a load capacitance between the output terminal Sout of the bootstrap circuit 10 and the ground terminal. Moreover, the conventional bootstrap circuit 10 has the inherent parasitic capacitance. In a case that the load capacitance of the load circuit and the parasitic capacitance are included in the conventional bootstrap circuit 10, the operations of the conventional bootstrap circuit 10 are adversely affected.

FIG. 1D schematically illustrates a conventional bootstrap circuit with a load capacitance. In comparison with the bootstrap circuit as shown in FIGS. 1A and 1B, the conventional bootstrap circuit 10 in FIG. 1D has a load capacitance $C_L$, which is indicated as a dotted line. The load capacitance $C_L$ represents the sum of the load capacitance of the load circuit and the parasitic capacitance.

When the load capacitance $C_L$ is taken into consideration, the voltage Vout at the output terminal Sout of the bootstrap circuit 10 is influenced by the load capacitance. The voltage Vout at the output terminal Sout of the bootstrap circuit 10 may be calculated by the following equation (1).

$$V_{out} = 2V_{DD} \times \frac{C_{B1}}{C_{B1} + C_L} = 2V_{DD} \times \frac{1}{1 \times C_L/C_{B1}} \quad (1)$$

In other words, in a case that the clock signal CLK is at the high voltage level, the high voltage level at the output terminal Sout of the bootstrap circuit 10 is not ideally equal to 2×Vdd. Whereas, the high voltage level at the output terminal Sout of the bootstrap circuit 10 is determined according to a ratio of the load capacitance $C_L$ to the capacitance of the first bootstrap capacitor $C_{B1}$.

As the ratio $C_L/C_{B1}$ is decreased, the influence of the ratio $C_L/C_{B1}$ on the output voltage Vout is decreased, and the efficiency of the bootstrap circuit 10 is increased. As the ratio $C_L/C_{B1}$ is increased, the influence of the ratio $C_L/C_{B1}$ on the high voltage level of the output voltage Vout is increased, and the efficiency of the bootstrap circuit 10 is decreased.

Due to the low mobility property, the parasitic capacitance at the high frequency is increased and the load capacitance $C_L$ is increased correspondingly. In other words, the high-frequency applications of the conventional bootstrap circuit 10 are affected by the parasitic capacitance and the load circuit. Under this circumstance, the high voltage level at the output terminal Sout of the bootstrap circuit 10 fails to be actually increased to 2×Vdd.

SUMMARY OF THE INVENTION

A first embodiment of the present invention provides a bootstrap circuit with an input terminal, an inverting input terminal, an output terminal and an inverting output terminal. The bootstrap circuit includes a first sub-bootstrap circuit, a second sub-bootstrap circuit, and a charging path providing circuit. The first sub-bootstrap circuit includes a first inverter, a first bootstrap capacitor, a first charging path, a first discharging path, and a first high voltage providing path. An input terminal of the first inverter is electrically connected with the input terminal of the bootstrap circuit. An output terminal of the first inverter is electrically connected with a first end of the first bootstrap capacitor. The first charging path is electrically connected between a second end of the first bootstrap capacitor and a power voltage. The first high voltage providing path is electrically connected between the second end of the first bootstrap capacitor and the output terminal of the bootstrap circuit. The first discharging path is electrically connected between the output terminal of the bootstrap circuit and a ground terminal. The first discharging path and the first high voltage providing path are controlled according to a voltage at the input terminal of the bootstrap circuit. The first charging path is controlled according to a voltage at the output terminal of the bootstrap circuit. The second sub-bootstrap circuit includes a second inverter, a second bootstrap capacitor, a second charging path, a second discharging path, and a second high voltage providing path. An input terminal of the second inverter is electrically connected with the inverting input terminal of the bootstrap circuit. An output terminal of the second inverter is electrically connected with a first end of the second bootstrap capacitor. The second charging path is electrically connected between a second end of the second bootstrap capacitor and the power voltage. The second high voltage providing path is electrically connected between the second end of the second bootstrap capacitor and the inverting output terminal of the bootstrap circuit. The second discharging path is electrically connected between the inverting output terminal of the bootstrap circuit and the ground terminal. The second discharging path and the second high voltage providing path are controlled according to a voltage at the inverting input terminal of the bootstrap circuit. The second charging path is controlled according to a voltage at the inverting output terminal of the bootstrap circuit. The charging path providing circuit includes a third charging path.

The third charging path is electrically connected between the power voltage and the second end of the first bootstrap capacitor. The third charging path is controlled according to the voltage at the inverting output terminal of the bootstrap circuit. In response to a high voltage level inputted into the input terminal of the bootstrap circuit, the first charging path and the third charging path are turned on, the first bootstrap capacitor is charged to a capacitor voltage, the first discharging path is turned on to discharge the output terminal of the bootstrap circuit, and the first high voltage providing path is turned off. In response to a low voltage level inputted into the input terminal of the bootstrap circuit, the first charging path and the third charging path and the first discharging path are turned off, the first high voltage providing path is turned on, and a first superimposed voltage including the high voltage level and the capacitor voltage is provided to the output terminal of the bootstrap circuit.

A second embodiment of the present invention provides a bootstrap circuit with an input terminal, an inverting input terminal, an output terminal and an inverting output terminal. The bootstrap circuit includes a first sub-bootstrap circuit, a second sub-bootstrap circuit, and a charging path providing circuit. The first sub-bootstrap circuit includes a first inverter, a first bootstrap capacitor, a first charging path, a first discharging path, and a first high voltage providing path. An input terminal of the first inverter is electrically connected with the input terminal of the bootstrap circuit. An output terminal of the first inverter is electrically connected with a first end of the first bootstrap capacitor. The first charging path is electrically connected between a second end of the first bootstrap capacitor and a power voltage. The first high voltage providing path is electrically connected between the second end of the first bootstrap capacitor and the output terminal of the bootstrap circuit. The first discharging path is electrically connected between the output terminal of the bootstrap circuit and a ground terminal. The first discharging path and the first high voltage providing path are controlled according to a voltage at the input terminal of the bootstrap circuit. The first charging path is controlled according to a voltage at the output terminal of the bootstrap circuit. The second sub-bootstrap circuit includes a second inverter, a second bootstrap capacitor, a second charging path, a second discharging path, and a second high voltage providing path. An input terminal of the second inverter is electrically connected with the inverting input terminal of the bootstrap circuit. An output terminal of the second inverter is electrically connected with a first end of the second bootstrap capacitor. The second charging path is electrically connected between a second end of the second bootstrap capacitor and the power voltage. The second high voltage providing path is electrically connected between the second end of the second bootstrap capacitor and the inverting output terminal of the bootstrap circuit. The second discharging path is electrically connected between the inverting output terminal of the bootstrap circuit and the ground terminal. The second discharging path and the second high voltage providing path are controlled according to a voltage at the inverting input terminal of the bootstrap circuit. The second charging path is controlled according to a voltage at the inverting output terminal of the bootstrap circuit. The charging path providing circuit includes a fourth charging path. The fourth charging path is electrically connected between the power voltage and the second end of the second bootstrap capacitor. The fourth charging path is controlled according to the voltage at the output terminal of the bootstrap circuit. In response to a high voltage level inputted into the inverting input terminal of the bootstrap circuit, the second charging path and the fourth charging path are turned on, the second bootstrap capacitor is charged to a capacitor voltage, the second discharging path is turned on to discharge the inverting output terminal of the bootstrap circuit, and the second high voltage providing path is turned off. In response to a low voltage level inputted into the input terminal of the bootstrap circuit, the second charging path and the fourth charging path and the second discharging path are turned off, the second high voltage providing path is turned on, and a second superimposed voltage including the high voltage level and the capacitor voltage is provided to the inverting output terminal of the bootstrap circuit.

A third embodiment of the present invention provides a bootstrap circuit with an input terminal, an inverting input terminal, an output terminal and an inverting output terminal. The bootstrap circuit includes a first sub-bootstrap circuit, a second sub-bootstrap circuit, and a discharging path providing circuit. The first sub-bootstrap circuit includes a first inverter, a first bootstrap capacitor, a first charging path, a first discharging path, and a first high voltage providing path. An input terminal of the first inverter is electrically connected with the input terminal of the bootstrap circuit. An output terminal of the first inverter is electrically connected with a first end of the first bootstrap capacitor. The first charging path is electrically connected between a second end of the first bootstrap capacitor and a power voltage. The first high voltage providing path is electrically connected between the second end of the first bootstrap capacitor and the output terminal of the bootstrap circuit. The first discharging path is electrically connected between the output terminal of the bootstrap circuit and a ground terminal. The first discharging path and the first high voltage providing path are controlled according to a voltage at the input terminal of the bootstrap circuit. The first charging path is controlled according to a voltage at the output terminal of the bootstrap circuit. The second sub-bootstrap circuit includes a second inverter, a second bootstrap capacitor, a second charging path, a second discharging path, and a second high voltage providing path. An input terminal of the second inverter is electrically connected with the inverting input terminal of the bootstrap circuit. An output terminal of the second inverter is electrically connected with a first end of the second bootstrap capacitor. The second charging path is electrically connected between a second end of the second bootstrap capacitor and the power voltage. The second high voltage providing path is electrically connected between the second end of the second bootstrap capacitor and the inverting output terminal of the bootstrap circuit. The second discharging path is electrically connected between the inverting output terminal of the bootstrap circuit and the ground terminal. The second discharging path and the second high voltage providing path are controlled according to a voltage at the inverting input terminal of the bootstrap circuit. The second charging path is controlled according to a voltage at the inverting output terminal of the bootstrap circuit. The discharging path providing circuit includes a third discharging path. The third discharging path is electrically connected between the ground terminal and the output terminal of the bootstrap circuit. The third discharging path is controlled according to the voltage at the inverting output terminal of the bootstrap circuit. When the third discharging path is turned on, the output terminal of the bootstrap circuit is discharged to the ground terminal through the third discharging path.

A fourth embodiment of the present invention provides a bootstrap circuit with an input terminal, an inverting input terminal, an output terminal and an inverting output terminal. The bootstrap circuit includes a first sub-bootstrap circuit, a second sub-bootstrap circuit, and a discharging path providing circuit. The bootstrap circuit includes a first sub-bootstrap circuit, a second sub-bootstrap circuit, and a discharging path providing circuit. The first sub-bootstrap circuit includes a first inverter, a first bootstrap capacitor, a first charging path, a first discharging path, and a first high voltage providing path. An input terminal of the first inverter is electrically connected with the input terminal of the bootstrap circuit. An output terminal of the first inverter is electrically connected with a first end of the first bootstrap capacitor. The first charging path is electrically connected between a second end of the first bootstrap capacitor and a power voltage. The first high voltage providing path is electrically connected between the second end of the first bootstrap capacitor and the output terminal of the bootstrap circuit. The first discharging path is electrically connected between the output terminal of the bootstrap circuit and a ground terminal. The first discharging path and the first high voltage providing path are controlled according to a voltage at the input terminal of the bootstrap circuit. The first charging path is controlled according to a voltage at the output terminal of the bootstrap circuit. The second sub-bootstrap circuit includes a second inverter, a second bootstrap capacitor, a second charging path, a second discharging path, and a second high voltage providing path. An input terminal of the second inverter is electrically connected with the inverting input terminal of the bootstrap circuit. An output terminal of the second inverter is electrically connected with a first end of the second bootstrap capacitor. The second charging path is electrically connected between a second end of the second bootstrap capacitor and the power voltage. The second high voltage providing path is electrically connected between the second end of the second bootstrap capacitor and the inverting output terminal of the bootstrap circuit. The second discharging path is electrically connected between the inverting output terminal of the bootstrap circuit and the ground terminal. The second discharging path and the second high voltage providing path are controlled according to a voltage at the inverting input terminal of the bootstrap circuit. The second charging path is controlled according to a voltage at the inverting output terminal of the bootstrap circuit. The discharging path providing circuit includes a fourth discharging path. The fourth discharging path is electrically connected between the ground terminal and the inverting output terminal of the bootstrap circuit. If the voltage at the output terminal of the bootstrap circuit is equal to a first superimposed voltage, the fourth discharging path is turned on, and the inverting output terminal of the bootstrap circuit is discharged to the ground terminal through the fourth discharging path.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
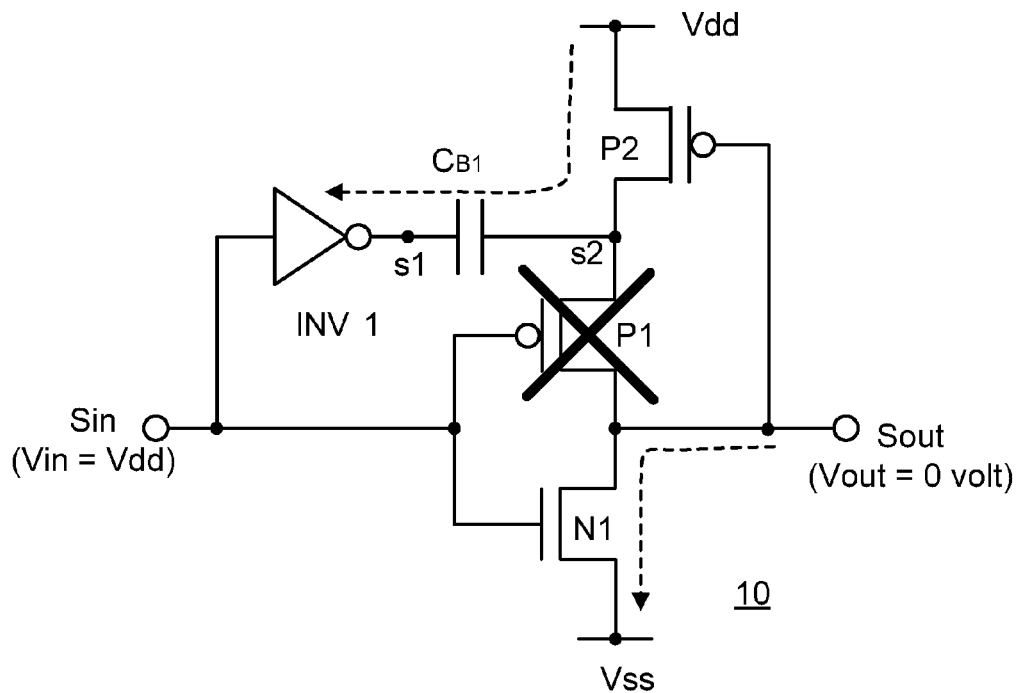
FIG. 1A (prior art) schematically illustrates a conventional bootstrap circuit, in which the input terminal is at a high voltage level.
Figure 1B:
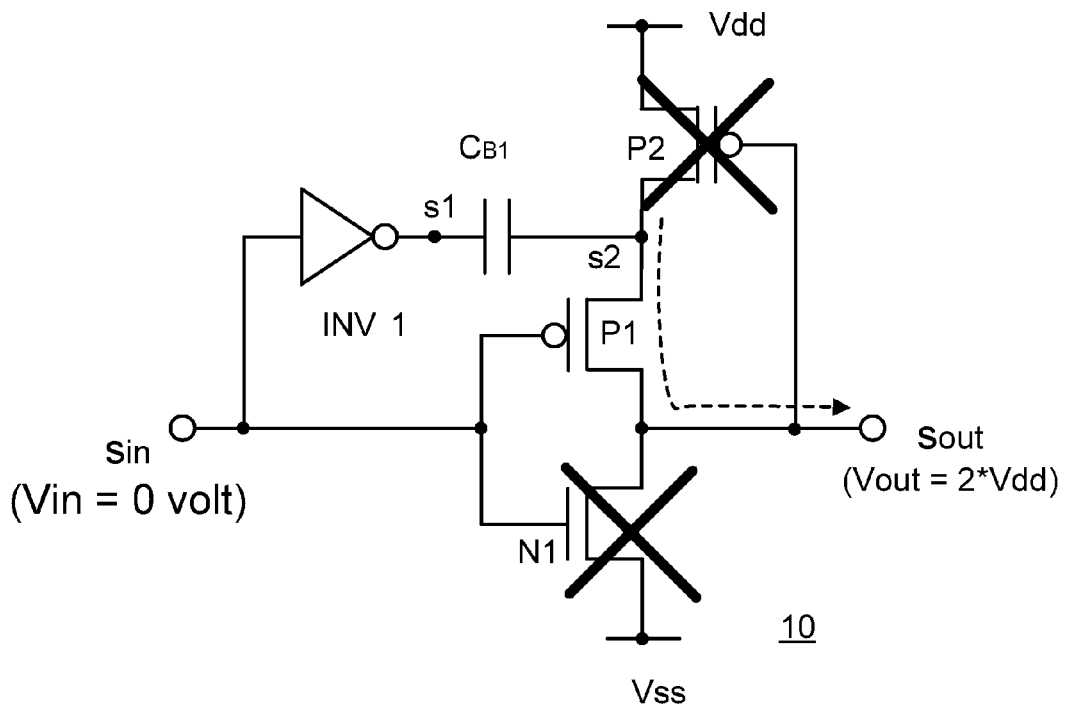
FIG. 1B (prior art) schematically illustrates a conventional bootstrap circuit, in which the input terminal is at a low voltage level.
Figure 1C:
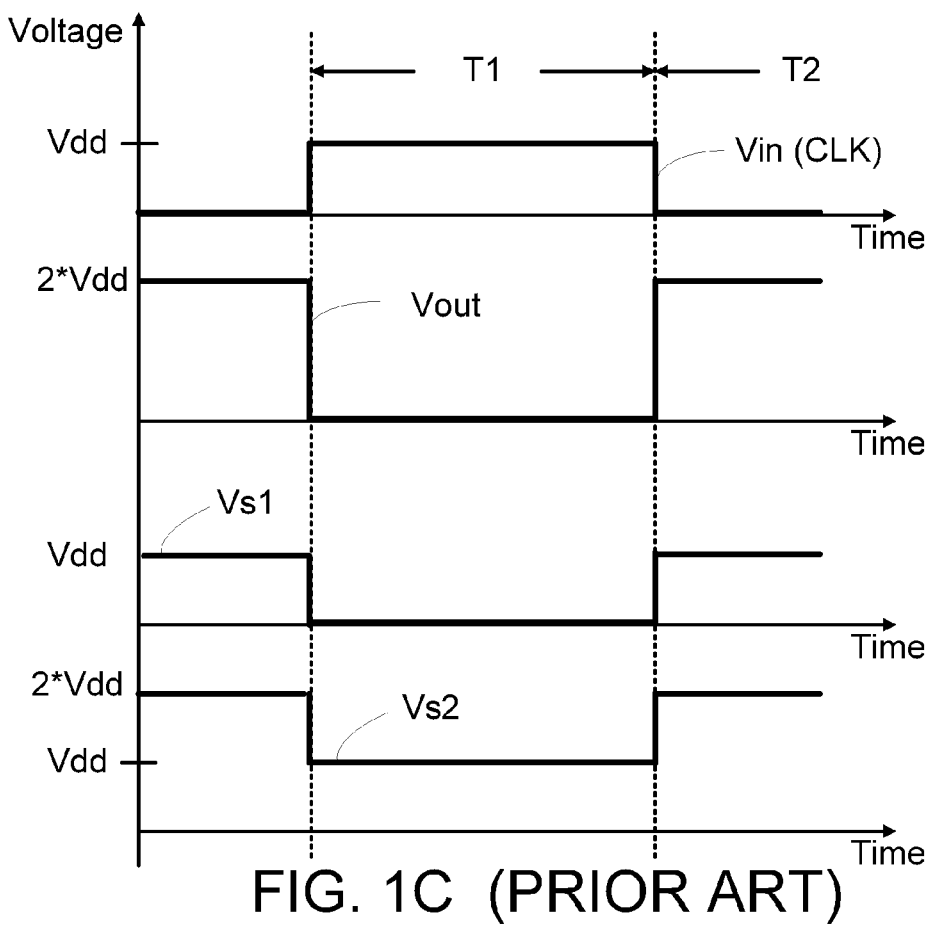
FIG. 1C (prior art) is a schematic timing waveform diagram illustrating associated voltage signals processed in the bootstrap circuit of FIGS. 1A and 1B.
Figure 1D:
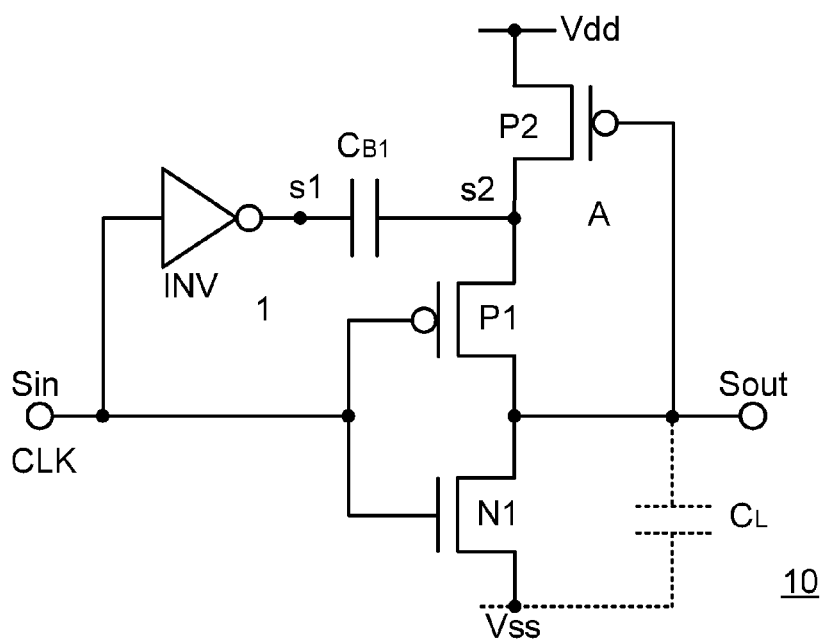
FIG. 1D (prior art) schematically illustrates a conventional bootstrap circuit with a load capacitance.
Figure 2A:
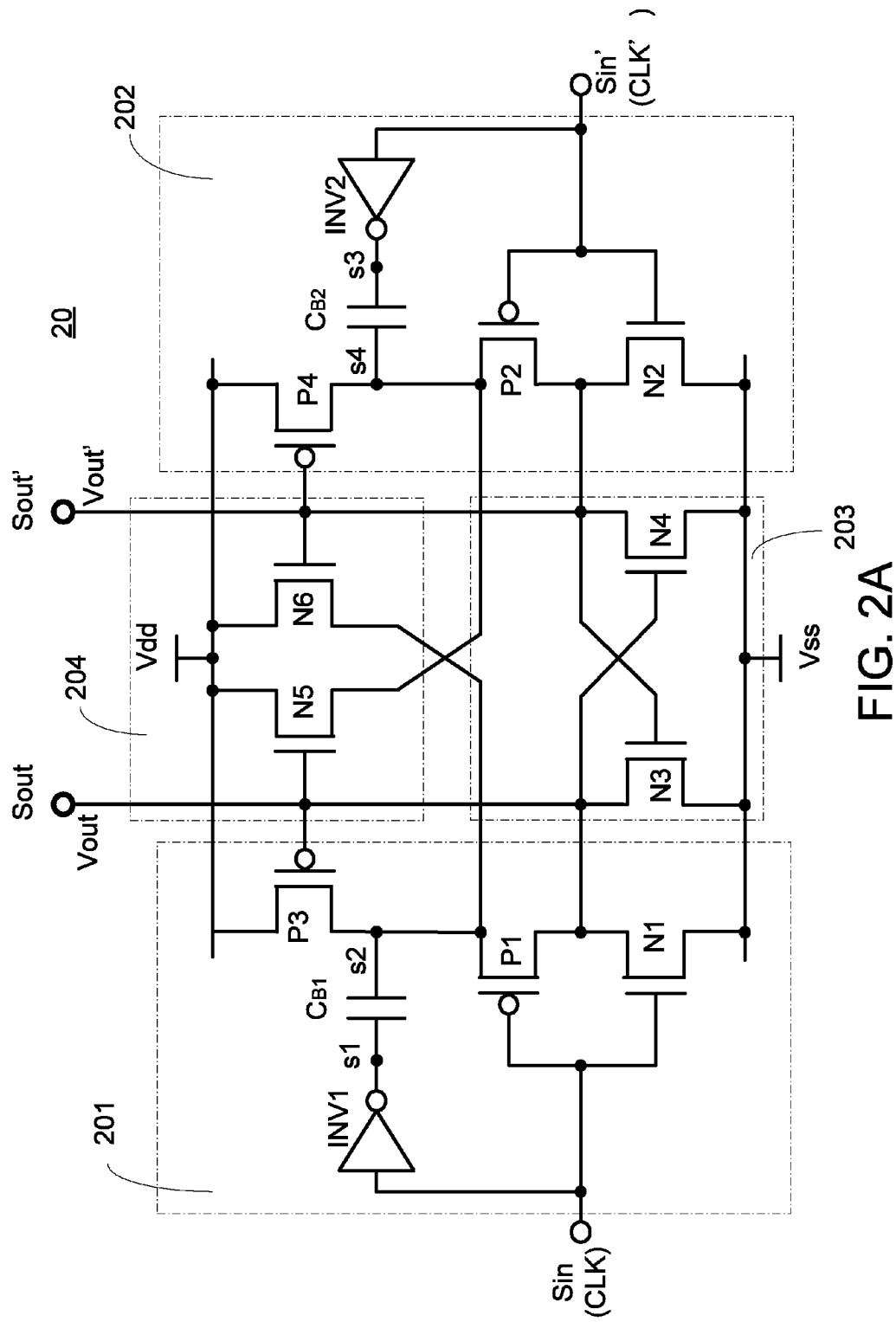
FIG. 2A schematically illustrates a bootstrap circuit according to a first embodiment of the present invention.

FIG. 2A schematically illustrates a bootstrap circuit according to a first embodiment of the present invention. As shown in FIG. 2A, the bootstrap circuit 20 includes a sub-bootstrap circuit pair, a discharging path providing circuit 203, and a charging path providing circuit 204. The sub-bootstrap circuit pair includes a first sub-bootstrap circuit 201 (in the left side) and a second sub-bootstrap circuit 202 (in the right side). The charging path providing circuit 204 is used for assisting the sub-bootstrap circuit in providing the current injecting function. Hereinafter, the configurations of the bootstrap circuit 20 and the operations of the bootstrap circuit 20 in response to the voltage level change of the clock signal CLK will be illustrated with reference to FIGS. 2A, 2B and 2C.

As shown in FIG. 2A, the first sub-bootstrap circuit 201 (in the left side) includes a first N-type transistor N1, a first P-type transistor P1, a third P-type transistor P3, a first inverter INV1, and a first bootstrap capacitor $C_{B1}$. The second sub-bootstrap circuit 202 (in the right side) includes a second N-type transistor N2, a second P-type transistor P2, a fourth P-type transistor P4, a second inverter INV2, and a second bootstrap capacitor $C_{B2}$.

In the first sub-bootstrap circuit 201, electrical charges may be discharged from the output terminal Sout of the bootstrap circuit 20 through the first N-type transistor N1. Consequently, the first N-type transistor N1 may be considered as a first discharging path. In a case that the first P-type transistor P1 is turned on, the voltage at the output terminal Sout of the bootstrap circuit 20 has the high voltage level. Consequently, the first P-type transistor P1 may be considered as a first high voltage providing path. In a case that the third P-type transistor P3 is turned on, the first bootstrap capacitor $C_{B1}$ is conducted. Consequently, the third P-type transistor P3 may be considered as a first charging path.

The input terminal of the first inverter INV1, the gate terminal of the first N-type transistor N1 and the gate terminal of the first P-type transistor P1 are all electrically connected with an input terminal Sin of the bootstrap circuit 20. A clock signal CLK is inputted into the bootstrap circuit 20 through the input terminal Sin of the bootstrap circuit 20.

Moreover, the drain terminals of the first P-type transistor P1 and the first N-type transistor N1 are both electrically connected with the output terminal Sout of the bootstrap circuit 20. The source voltage of the first N-type transistor N1 is electrically connected with a ground terminal Vss. The source terminal of the first P-type transistor P1 is electrically connected with a second node s2.

A second end of the first bootstrap capacitor $C_{B1}$ and the drain terminal of the third P-type transistor P3 are also electrically connected with the second node s2. The output terminal of the first inverter INV1 is electrically connected with a first end of the first bootstrap capacitor $C_{B1}$ through a first node s1. The source terminal of the third P-type transistor P3 is electrically connected with a power voltage Vdd. The gate terminal of the third P-type transistor P3 is electrically connected with the output terminal Sout of the bootstrap circuit 20.

In the second sub-bootstrap circuit 202, electrical charges may be discharged from the inverting output terminal Sout' of the bootstrap circuit 20 through the second N-type transistor N2. Consequently, the second N-type transistor N2 may be considered as a second discharging path. In a case that the second P-type transistor P2 is turned on, the voltage at the inverting output terminal Sout' of the bootstrap circuit 20 has the high voltage level. Consequently, the second P-type transistor P2 may be considered as a second high voltage providing path. In a case that the fourth P-type transistor P4 is turned on, the second bootstrap capacitor $C_{B2}$ is conducted. Consequently, the fourth P-type transistor P4 may be considered as a second charging path.

The input terminal of the second inverter INV2, the gate terminals of the second N-type transistor N2 and the second P-type transistor P2 are all electrically connected with an inverting input terminal Sin' of the bootstrap circuit 20. An inverting clock signal CLK' is inputted into the bootstrap circuit 20 through the inverting input terminal Sin' of the bootstrap circuit 20.

Moreover, the drain terminals of the second P-type transistor P2 and the second N-type transistor N2 are both electrically connected with the inverting output terminal Sout' of the bootstrap circuit 20. The source terminal of the second N-type transistor N2 is electrically connected with the ground terminal Vss. The source terminal of the second P-type transistor P2 is electrically connected with a fourth node s4.

A second end of the second bootstrap capacitor $C_{B2}$ and the drain terminal of the fourth P-type transistor P4 are also electrically connected with the fourth node s4. The output terminal of the second inverter INV2 is electrically connected with a first end of the second bootstrap capacitor $C_{B2}$ through a third node s3. The source terminal of the fourth P-type transistor P4 is electrically connected with the power voltage Vdd. The gate terminal of the fourth P-type transistor P4 is electrically connected with the inverting output terminal Sout' of the bootstrap circuit 20.

Please refer to FIG. 2A again. The charging path providing circuit 203 includes a third N-type transistor N3 and a fourth N-type transistor N4. The charging path providing circuit 204 includes a fifth N-type transistor N5 and a sixth N-type transistor N6.

The discharging path providing circuit 203 and the charging path providing circuit 204 are both arranged between the first sub-bootstrap circuit 201 and the second sub-bootstrap circuit 202. However, the discharging path providing circuit 203 is electrically connected with the ground terminal Vss, the first N-type transistor N1 and the second N-type transistor N2. The charging path providing circuit 204 is electrically connected with the power voltage Vdd, the third P-type transistor P3 and the fourth P-type transistor P4.

In the discharging path providing circuit 203, the drain terminal of the third N-type transistor N3 and the gate terminal of the fourth N-type transistor N4 are electrically connected with the output terminal Sout of the bootstrap circuit 20. The gate terminal of the third N-type transistor N3 and the drain terminal of the fourth N-type transistor N4 are electrically connected with the inverting output terminal Sout' of the bootstrap circuit 20. Moreover, the source terminal of the third N-type transistor N3 and the source terminal of the fourth N-type transistor N4 are electrically connected with the ground terminal Vss.

In the charging path providing circuit 204, the drain terminals of the fifth N-type transistor N5 and the sixth N-type transistor N6 are both electrically connected with the power voltage Vdd. The gate terminal of the fifth N-type transistor N5 is electrically connected with the output terminal Sout of the bootstrap circuit 20. The gate terminal of the sixth N-type transistor N6 is electrically connected with the inverting output terminal Sout' of the bootstrap circuit 20. The source terminal of the fifth N-type transistor N5 is electrically connected with the fourth node s4 of the second sub-bootstrap circuit 202. The source terminal of the sixth N-type transistor N6 is electrically connected with the second node s2 of the first sub-bootstrap circuit 201.

In this embodiment, the clock signal CLK is inputted into the input terminal Sin of the bootstrap circuit 20, and the inverting clock signal CLK' is inputted into the inverting input terminal Sin' of the bootstrap circuit 20.

Figure 2B:
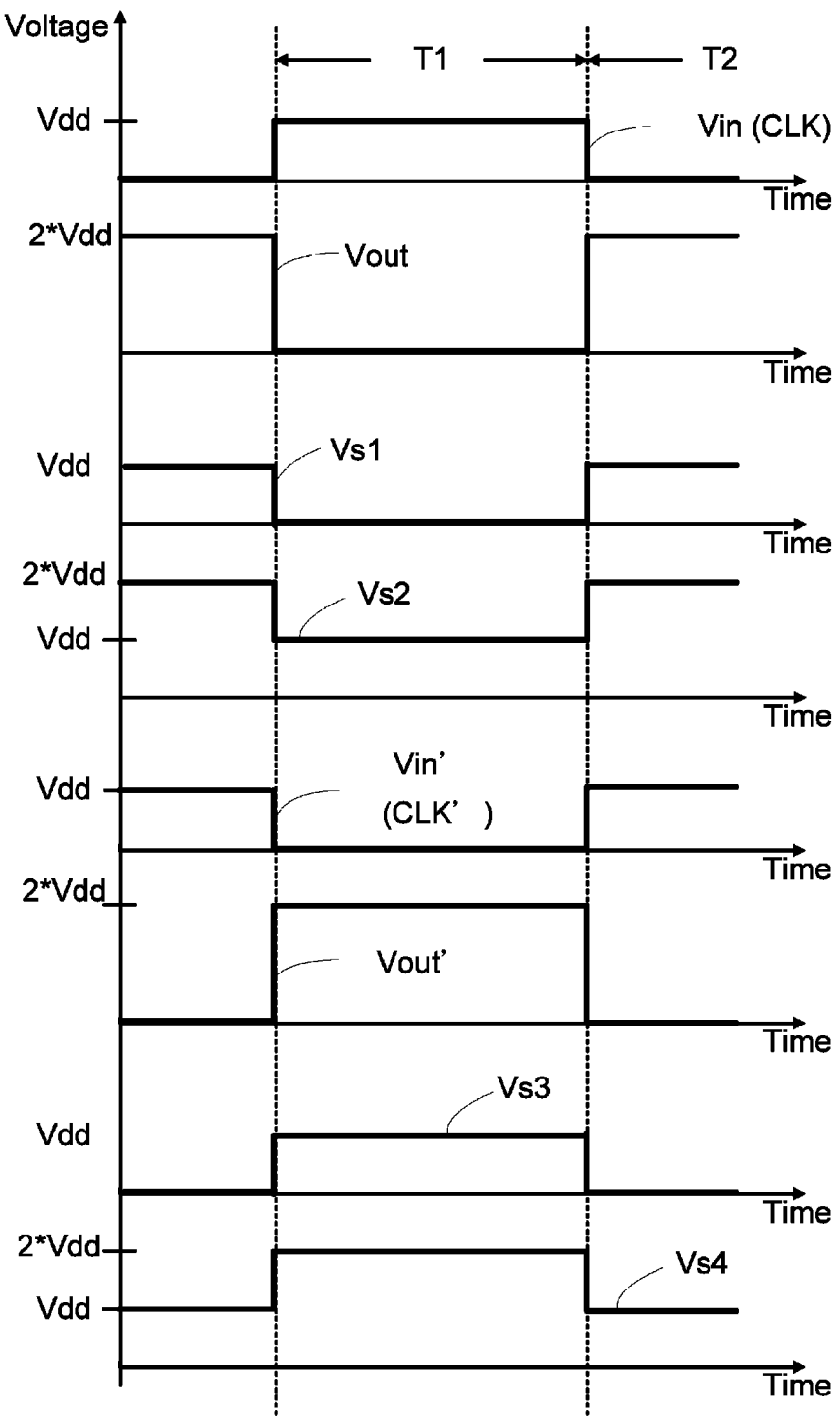
FIG. 2B is a schematic timing waveform diagram illustrating associated voltage signals processed in the bootstrap circuit of FIG. 2A.

FIG. 2B is a schematic timing waveform diagram illustrating associated voltage signals processed in the bootstrap circuit of FIG. 2A. As shown in FIG. 2B, the clock signal CLK inputted into the input terminal of the bootstrap circuit has a low voltage level equal to the voltage at the ground terminal Vss and a high voltage level equal to the power voltage Vdd.

Figure 2C:
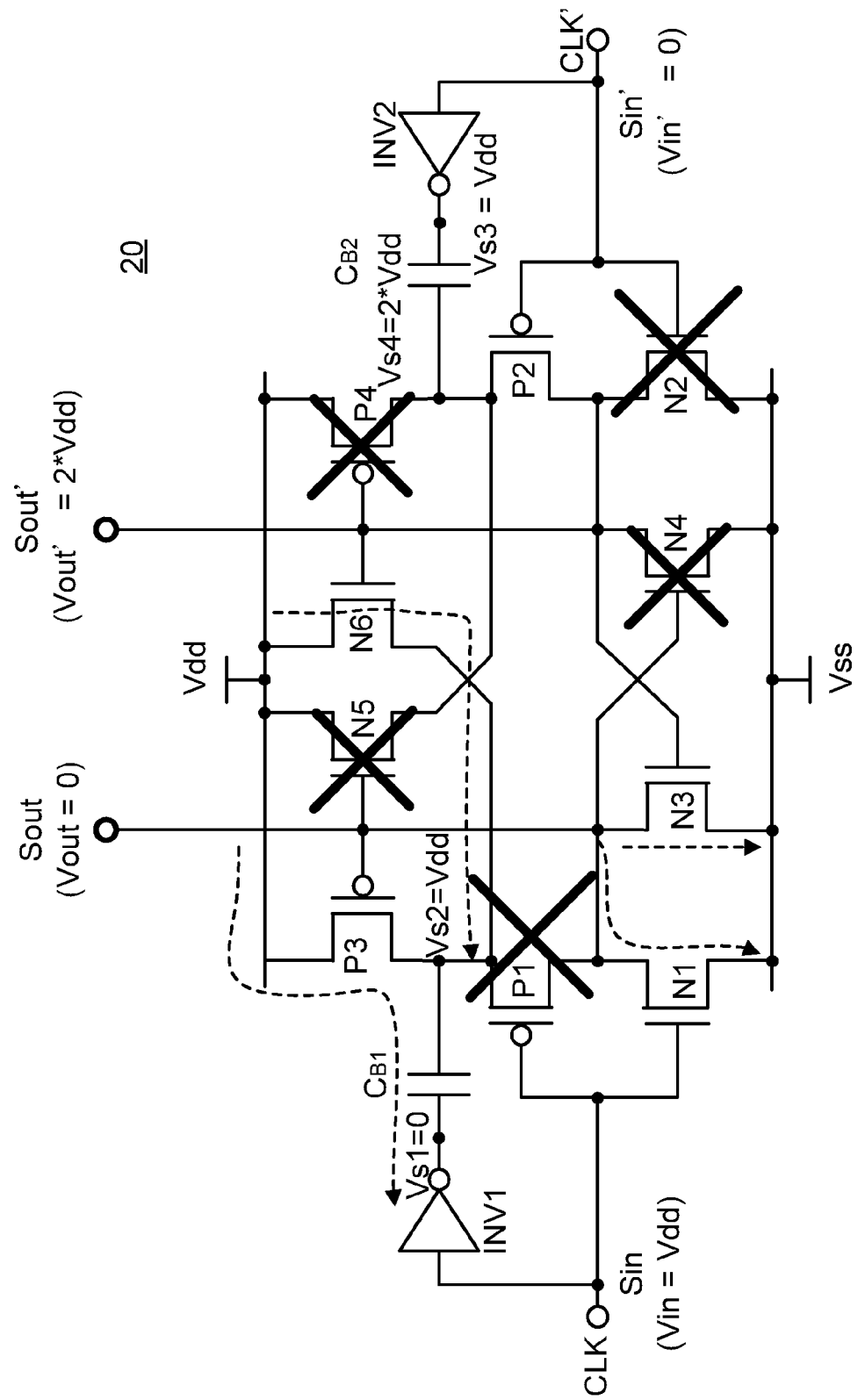
FIG. 2C schematically illustrates the on/off statuses of the transistors of the bootstrap circuit of FIG. 2A in response to the high voltage level of the clock signal.
Figure 2D:
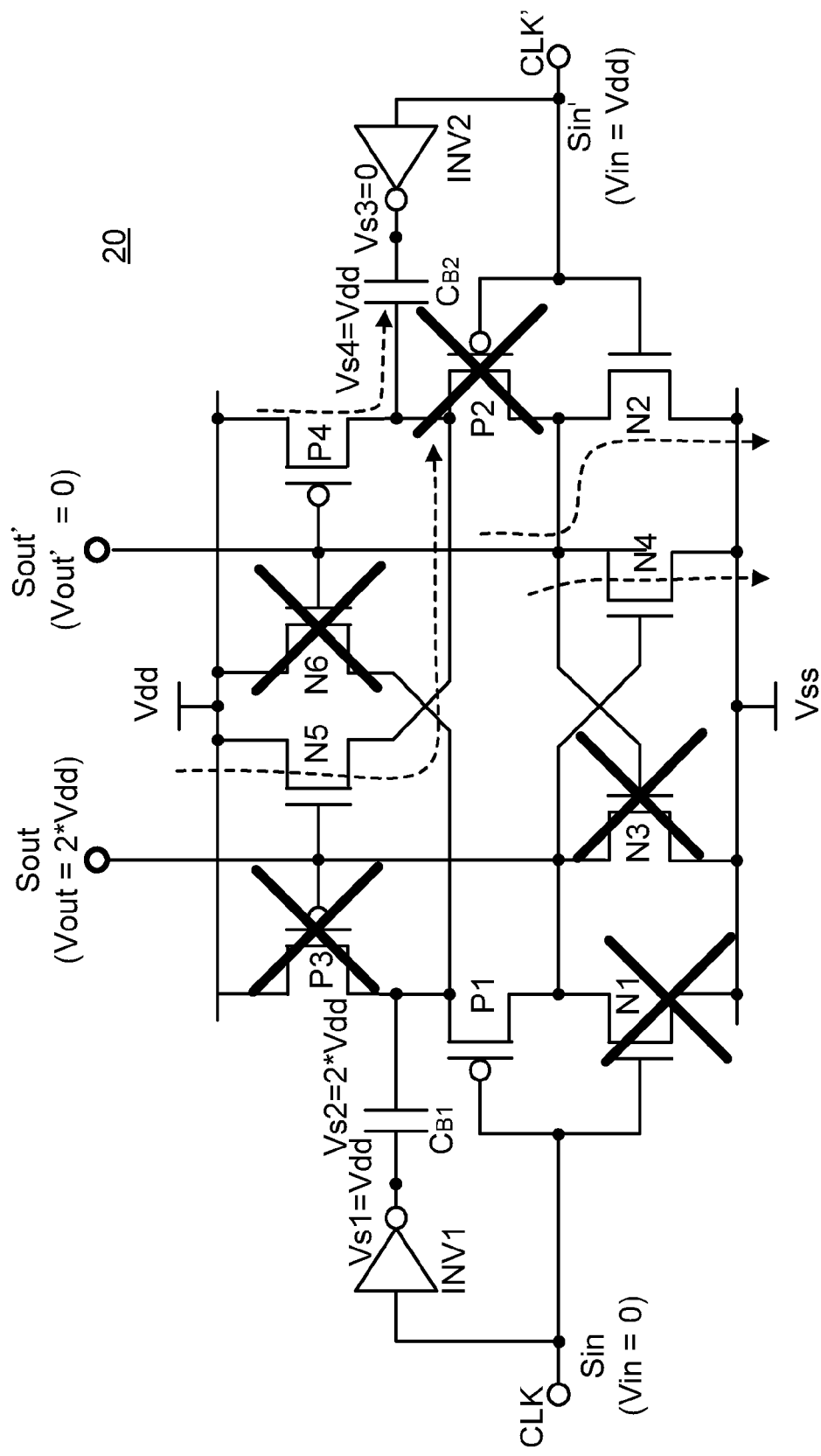
FIG. 2D schematically illustrates the on/off statuses of the transistors of the bootstrap circuit of FIG. 2A in response to the low voltage level of the clock signal.

FIG. 2C schematically illustrates the on/off statuses of the transistors of the bootstrap circuit in response to the high voltage level of the clock signal of FIG. 2A. FIG. 2D schematically illustrates the on/off statuses of the transistors of the bootstrap circuit in response to the low voltage level of the clock signal of FIG. 2A.

Hereinafter, the operations of the bootstrap circuit 20 will be illustrated with reference to FIGS. 2A, 2B, 2C and 2D. The voltages of respective nodes during the first time period T1 may be illustrated with reference to FIG. 2C, and the voltages of respective nodes during the second time period T2 may be illustrated with reference to FIG. 2D. For comparison, it is assumed that the voltage of the clock signal CLK during the first time period T1 is maintained at the high voltage level (=Vdd), and the voltage of the clock signal CLK during the second time period T2 is maintained at the low voltage level (=Vss).

In FIG. 2B, eight waveforms are sequentially shown from top to bottom. The first waveform (i.e. the topmost waveform) denotes the change of the voltage Vin at the input terminal Sin of the bootstrap circuit. The second waveform denotes the change of the voltage Vout at the output terminal Sout of the bootstrap circuit. The third waveform denotes the change of the voltage Vs1 at the first node s1. The fourth waveform denotes the change of the voltage Vs2 at the second node s2. The fifth waveform denotes the change of the voltage Vin' at the inverting input terminal Sin' of the bootstrap circuit. The sixth waveform denotes the change of the voltage Vout' at the inverting output terminal Sout' of the bootstrap circuit. The seventh waveform denotes the change of the voltage Vs3 at the third node s3. The eighth waveform denotes the change of the voltage Vs4 at the fourth node s4. The first, second, third and fourth waveforms are complementary to the fifth, sixth, seventh and eighth waveforms, respectively.

The voltage Vin at the input terminal Sin of the bootstrap circuit is maintained at the high voltage level Vdd during the first time period T1 and maintained at the low voltage level Vss during the second time period T2. The voltage Vout at the output terminal Sout of the bootstrap circuit 20 is maintained at 0 volt during the first time period T1 and maintained at 2×Vdd during the second time period T2.

The voltage Vs1 at the first node s1 of the bootstrap circuit is maintained at 0 volt during the first time period T1 and maintained at Vdd during the second time period T2. The voltage Vs2 at the second node s2 of the bootstrap circuit is maintained at Vdd during the first time period T1 and maintained at 2×Vdd during the second time period T2.

The voltage Vin' at the inverting input terminal Sin' of the bootstrap circuit is maintained at the low voltage level Vss during the first time period T1 and maintained at the high voltage level Vdd during the second time period T2. The voltage Vout' at the inverting output terminal Sout' of the bootstrap circuit is maintained at 2×Vdd during the first time period T1 and maintained at 0 volt during the second time period T2.

The voltage Vs3 at the third node s3 of the bootstrap circuit is maintained at Vdd during the first time period T1 and maintained at 0 volt during the second time period T2. The voltage Vs4 at the fourth node s4 of the bootstrap circuit is maintained at 2×Vdd during the first time period T1 and maintained at Vdd during the second time period T2.

As shown in FIG. 2A, the clock signal CLK is inputted into the input terminal Sin of the bootstrap circuit 20, and the inverting clock signal CLK' is inputted into the inverting input terminal Sin' of the bootstrap circuit 20. Moreover, the transistors in the first sub-bootstrap circuit 201, the second sub-bootstrap circuit 202, the discharging path providing circuit 203 and the charging path providing circuit 204 are symmetric. Due to the symmetrical configuration, the voltages at the left side of the bootstrap circuit 20 and the voltages at the right side of the bootstrap circuit 20 are complementary to each other.

Moreover, as shown in FIG. 2B, the waveforms of the voltages Vin, Vout, Vs1 and Vs2 during the first time period T1 are respectively identical to the waveforms of the voltages Vin', Vout', Vs3 and Vs4 during the second time period T2. Similarly, the waveforms of the voltages Vin, Vout, Vs1 and Vs2 during the second time period T2 are respectively identical to the waveforms of the voltages Vin', Vout', Vs3 and Vs4 during the first time period T1.

Please refer to FIG. 2C and the first time period T1 of FIG. 2B. The clock signal CLK is at the high voltage level Vdd. In a case that the clock signal CLK inputted into the input terminal Sin of the bootstrap circuit 20 is at the high voltage level, the voltage at the input terminal Sin is at the high voltage level Vdd. Since the inverting clock signal CLK' inputted into the inverting input terminal Sin' of the bootstrap circuit 20 is at the low voltage level, the voltage at the inverting input terminal Sin' is at the low voltage level Vss.

In a case that the voltage at the input terminal Sin is at the high voltage level Vdd, the voltage at the gate terminal of the first N-type transistor N1 and the voltage at the gate terminal of the first P-type transistor P1 are both at the high voltage level Vdd. Under this circumstance, the first N-type transistor N1 is turned on, and the first P-type transistor P1 is turned off.

Since the first N-type transistor N1 is turned on, electrical charges may be discharged from the output terminal Sout of the bootstrap circuit 20 through the first N-type transistor N1. Under this circumstance, the voltage Vout at the output terminal Sout of the bootstrap circuit is equal to the voltage at the ground terminal (0 volt).

Correspondingly, since the gate terminal of the third P-type transistor P3 is electrically connected with the output terminal Sout of the bootstrap circuit 20, the voltage at the gate terminal of the third P-type transistor P3 is 0 volt. Under this circumstance, the third P-type transistor P3 is turned on, and thus the voltage Vs2 at the second node s2 of the bootstrap circuit is equal to Vdd.

Moreover, since the voltage at the input terminal Sin is at the high voltage level Vdd during the first time period T1, the voltage at the first node s1 (i.e. the output voltage of the first inverter INV1) is 0 volt. Since the first end and the second end of the first bootstrap capacitor $C_{B1}$ are respectively connected with the first node s1 and the second node s2, the voltage difference between the first and the second ends of the first bootstrap capacitor $C_{B1}$ is equal to a capacitor voltage Vdd. Under this circumstance, the first bootstrap capacitor $C_{B1}$ is charged to Vdd.

As mentioned above, since the inverting clock signal CLK' inputted into the inverting input terminal Sin' of the bootstrap circuit 20 is at the low voltage level, the voltage at the inverting input terminal Sin' is at the low voltage level Vss.

Meanwhile, the voltage Vs3 at the third node s3 (i.e. the output voltage of the second inverter INV2) is equal to Vdd. Since the voltage difference between both ends of the second bootstrap capacitor $C_{B2}$ is equal to the capacitor voltage Vdd, the voltage Vs4 at the fourth node s4 is correspondingly increased to a second superimposed voltage, which is equal to 2×Vdd (i.e. Vdd+Vdd=2×Vdd). The voltage Vs3 at the third node s3 and the voltage Vs4 at the fourth node s4 are shown in FIG. 2B.

The gate terminal of the second N-type transistor N2 and the gate terminal of the second P-type transistor P2 are both electrically connected with the inverting input terminal Sin' of the bootstrap circuit 20. Consequently, the voltage at the gate terminal of the second N-type transistor N2 and the voltage at the gate terminal of the second P-type transistor P2 are at the low voltage level during the first time period T1. Under this circumstance, the second N-type transistor N2 is turned off and the second P-type transistor P2 is turned on. Since the second P-type transistor P2 is turned on, the voltage Vs4 at the fourth node s4 (=2×Vdd) is transferred to the inverting output terminal Sout' of the bootstrap circuit 20. Consequently, during the first time period T1, the voltage Vout' at the inverting output terminal Sout' of the bootstrap circuit 20 is equal to 2×Vdd.

The behaviors of the discharging path providing circuit 203 during the first time period T1 will be discussed as follows. Since the gate terminal of the third N-type transistor N3 is electrically connected with the inverting output terminal Sout' of the bootstrap circuit 20, the voltage at the gate terminal of the third N-type transistor N3 is equal to 2×Vdd. Consequently, the third N-type transistor N3 is turned on during the first time period T1, and the output terminal Sout of the bootstrap circuit 20 is electrically connected with the ground terminal through the third N-type transistor N3. On the other hand, since the gate terminal of the fourth N-type transistor N4 is electrically connected with the output terminal Sout of the bootstrap circuit 20, the voltage at the gate terminal of the fourth N-type transistor N4 is equal to the low voltage level. Consequently, during the first time period T1, the fourth N-type transistor N4 is turned off.

The behaviors of the charging path providing circuit 204 will be discussed as follows. Since the gate terminal of the fifth N-type transistor N5 is electrically connected with the output terminal Sout of the bootstrap circuit 20, the voltage at the gate terminal of the fifth N-type transistor N5 is at the low voltage level during the first time period T1. Under this circumstance, the fifth N-type transistor N5 is turned off. Moreover, since the gate terminal of the sixth N-type transistor N6 is electrically connected with the inverting output terminal Sout' of the bootstrap circuit 20, the voltage at the gate terminal of the sixth N-type transistor N6 is equal to 2×Vdd. Consequently, during the first time period T1, the sixth N-type transistor N6 is turned on. Since the sixth N-type transistor N6 is turned on, the power voltage Vdd connected with the drain terminal of the sixth N-type transistor N6 is transferred to the second node s2.

From the above discussions, in a case that the clock signal CLK is at the high voltage level Vdd, the transistors P3, N1, N3, N6 and P2 are turned on, and the transistors P1, N4, N5, N2 and P4 are turned off.

Hereinafter, the influences of the on/off statuses of the transistors of the bootstrap circuit 20 will be illustrated as follows.

In a case that the clock signal CLK is maintained at the high voltage level Vdd during the first time period T1, two currents flows to the second node s2. One current flows to the second node s2 through the third P-type transistor P3. The other current flows to the second node s2 through the sixth N-type transistor N6 of the charging path providing circuit 204. Consequently, the charging speed of the first bootstrap capacitor $C_{B1}$ is enhanced. Moreover, since the first N-type transistor N1 and the third N-type transistor N3 are turned on, the output terminal Sout of the bootstrap circuit 20 is connected with the ground terminal Vss.

Moreover, since the inverting clock signal CLK' is maintained at the low voltage level during the first time period T1, the voltage Vs4 at the fourth node s4 is equal to 2×Vdd. Since the second P-type transistor P2 is turned on, voltage at the inverting output terminal Sout' of the bootstrap circuit 20 is equal to 2×Vdd.

Please refer to FIG. 2D and the second time period T2 of FIG. 2B. The clock signal CLK is at the low voltage level Vss. In a case that the clock signal CLK inputted into the input terminal Sin of the bootstrap circuit 20 is at the low voltage level, the voltage Vin at the input terminal Sin is at the low voltage level (Vin=0 volt). Since the inverting clock signal CLK' inputted into the inverting input terminal Sin' of the bootstrap circuit 20 is at the high level, the voltage Vin' at the inverting input terminal Sin' is at the high voltage level (Vin=Vdd).

The behaviors of the first sub-bootstrap circuit 201 during the second time period T2 will be illustrated as follows. Since the clock signal CLK is at the low voltage level (0 volt), the voltage at the first node s1 (i.e. the output voltage of the first inverter INV1) is equal to the high voltage level Vdd. Since the first bootstrap capacitor $C_{B1}$ is charged during the first time period T1, the voltage difference between the two ends of the first bootstrap capacitor $C_{B1}$ is equal to the capacitor voltage Vdd. Consequently, when the voltage at the first node s1 is increased to Vdd during the second time period T2, the voltage at the second node s2 is correspondingly increased to a first superimposed voltage, which is equal to 2×Vdd (i.e. Vdd+Vdd=2×Vdd).

The gate terminal of the first P-type transistor P1 and the gate terminal of the first N-type transistor N1 are both electrically connected with the input terminal Sin of the bootstrap circuit 20. Consequently, in response to the low voltage level of the clock signal CLK, the first P-type transistor P1 is turned on and the first N-type transistor N1 is turned off.

The source terminal of the first P-type transistor P1 is electrically connected with the second node s2. Since the first P-type transistor P1 is turned on, the first superimposed voltage 2×Vdd is transferred to the output terminal Sout of the bootstrap circuit 20 through the first P-type transistor P1. Consequently, during the second time period T2, the voltage Vout at the inverting output terminal Sout' of the bootstrap circuit 20 is equal to 2×Vdd. Moreover, since the gate terminal of the third P-type transistor P3 is electrically connected with the output terminal Sout of the bootstrap circuit 20, the third P-type transistor P3 is turned off during the second time period T2.

The behaviors of the second sub-bootstrap circuit 202 during the second time period T2 will be illustrated as follows. During the second time period T2, the inverting clock signal CLK' inputted into the inverting input terminal Sin' of the bootstrap circuit 20 is at the high level Vdd. Consequently, the voltage Vs3 at the third node s3 (i.e. the output voltage of the second inverter INV2) is equal to the low voltage level (0 volt). The gate terminals of the second N-type transistor N2 and the second P-type transistor P2 are both electrically connected with the inverting input terminal Sin' of the bootstrap circuit 20. Under this circumstance, the second P-type transistor P2 is turned off and the second N-type transistor N2 is turned on.

Since the second N-type transistor N2 is turned on, the inverting output terminal Sout' of the bootstrap circuit 20 is connected with the ground terminal Vss. Under this circumstance, the voltage at the inverting output terminal Sout' of the bootstrap circuit 20 is equal to 0 volt. Moreover, since the gate terminal of the fourth P-type transistor P4 is electrically connected with the inverting output terminal Sout' of the bootstrap circuit 20, the fourth P-type transistor P4 is turned on in response to the low voltage level at its gate terminal thereof. Moreover, since the fourth P-type transistor P4 is turned on, the voltage Vs4 at the fourth node s4 is maintained at Vdd during the second time period T2.

From the seventh waveform and the eighth waveform as shown in FIG. 2B, during the second time period T2, the voltages at the third node s3 and the fourth node s4 are equal to 0 volt and Vdd, respectively. Since the first end and the second end of the second bootstrap capacitor $C_{B2}$ are respectively connected with the third node s3 and the fourth node s4, the voltage difference between the first end and the second end of the second bootstrap capacitor $C_{B2}$ is equal to the capacitor voltage Vdd. Under this circumstance, it is considered that the second bootstrap capacitor $C_{B2}$ is charged during the second time period T2.

The behaviors of the discharging path providing circuit 203 during the second time period T2 will be discussed as follows. Since the gate terminal of the third N-type transistor N3 is electrically connected with the inverting output terminal Sout' of the bootstrap circuit 20, the voltage at the gate terminal of the third N-type transistor N3 is at the low voltage level. Consequently, the third N-type transistor N3 is turned off during the second time period T2. On the other hand, since the gate terminal of the fourth N-type transistor N4 is electrically connected with the output terminal Sout of the bootstrap circuit 20, the voltage at the gate terminal of the fourth N-type transistor N4 is equal to the high voltage level Vdd. Consequently, during the second time period T2, the fourth N-type transistor N4 is turned on.

The behaviors of the charging path providing circuit 204 will be discussed as follows. Since the gate terminal of the fifth N-type transistor N5 is electrically connected with the output terminal Sout of the bootstrap circuit 20, the voltage at the gate terminal of the fifth N-type transistor N5 is equal to 2×Vdd during the second time period T2. Under this circumstance, the fifth N-type transistor N5 is turned on. Moreover, since the gate terminal of the sixth N-type transistor N6 is electrically connected with the inverting output terminal Sout' of the bootstrap circuit 20, the voltage at the gate terminal of the sixth N-type transistor N6 is at the low voltage level (Vout'=Vss). Consequently, during the second time period T2, the sixth N-type transistor N6 is turned off.

From the above discussions, in a case that the clock signal CLK is at the low voltage level, the transistors P3, N1, N3, N6 and P2 are turned off, and the transistors P1, N4, N5, N2 and P4 are turned on.

Hereinafter, the influences of the on/off statuses of the transistors of the bootstrap circuit 20 will be illustrated as follows.

In a case that the clock signal CLK is maintained at the low voltage level during the second time period T2, two currents flows to the fourth node s4. One current flows to the fourth node s4 through the fourth P-type transistor P4. The other current flows to the fourth node s4 through the fifth N-type transistor N5 of the charging path providing circuit 204. Consequently, the power voltage Vdd is provided to the fourth node s4. In other words, since two charging paths provide currents to charge the second bootstrap capacitor $C_{B2}$, the charging speed of the second bootstrap capacitor $C_{B2}$ is enhanced. Moreover, since the second N-type transistor N2 and the fourth N-type transistor N4 are turned on, the inverting output terminal Sout' of the bootstrap circuit 20 is connected with the ground terminal Vss through the two charging paths.

From the above discussions as shown in FIGS. 2A-2D, the behaviors of the bootstrap circuit 20 may be concluded as follows.

As the voltage of the clock signal CLK inputted into the input terminal Sin of the bootstrap circuit 20 is changed, the voltage levels at the output terminal Sout and the inverting input terminal Sin' of the bootstrap circuit 20 are correspondingly changed. The voltage of the clock signal CLK during the first time period T1 is maintained at the high voltage level (=Vdd), and the voltage of the clock signal CLK during the second time period T2 is maintained at the low voltage level (=Vss).

Moreover, the bootstrap circuit 20 has the input terminal Sin, the inverting input terminal Sin', the output terminal Sout and the inverting output terminal Sout'. The bootstrap circuit 20 includes the first sub-bootstrap circuit 201, the second sub-bootstrap circuit 202, the discharging path providing circuit 203, and the charging path providing circuit 204.

The first sub-bootstrap circuit 201 includes the first inverter INV1, the first bootstrap capacitor $C_{B1}$, the first charging path (i.e. the third P-type transistor P3), the first discharging path (i.e. the first N-type transistor N1), and the first high voltage providing path (i.e. the first P-type transistor P1).

The second sub-bootstrap circuit 202 includes the second inverter INV2, the second bootstrap capacitor $C_{B2}$, the second charging path (i.e. the fourth P-type transistor P4), the second discharging path (i.e. the second N-type transistor N2), and the second high voltage providing path (i.e. the second P-type transistor P2).

The charging path providing circuit 204 includes a third charging path (i.e. the sixth N-type transistor N6) and a fourth charging path (i.e. the fifth N-type transistor N5). The third charging path (i.e. the sixth N-type transistor N6) is controlled by the voltage at the inverting output terminal Sout' of the bootstrap circuit 20. The fourth charging path (i.e. the fifth N-type transistor N5) is controlled by the voltage at the output terminal Sout of the bootstrap circuit 20.

In a case that the clock signal CLK inputted into the input terminal Sin of the bootstrap circuit 20 is at the high voltage level, the inverting clock signal CLK' inputted into the inverting input terminal Sin' of the bootstrap circuit 20 is at the low voltage level.

Since the voltage at the input terminal Sin of the bootstrap circuit 20 is at the high voltage level, the first charging path and the third charging path are turned on, and the first bootstrap capacitor $C_{B1}$ is charged to the capacitor voltage. Meanwhile, the first high voltage providing path is turned off, and electrical charges are discharged from the output terminal Sout of the bootstrap circuit 20 through the first discharging path.

Since the voltage at the inverting input terminal Sin' of the bootstrap circuit 20 is at the low voltage level, the second charging path, the fourth charging path and the second discharging path are turned off. Under this circumstance, the second high voltage providing path is turned on, and a second superimposed voltage including the high voltage level and the capacitor voltage is provided to the inverting output terminal Sout' of the bootstrap circuit 20.

In a case that the clock signal CLK inputted into the input terminal Sin of the bootstrap circuit 20 is at the low voltage level, the inverting clock signal CLK' inputted into the inverting input terminal Sin' of the bootstrap circuit 20 is at the high voltage level. Since the voltage Vin at the input terminal Sin of the bootstrap circuit 20 is at the low voltage level, the first charging path, the third charging path and the first discharging path are all turned off. In addition, the first high voltage providing path is turned on, and a first superimposed voltage including the high voltage level and the capacitor voltage is provided to the output terminal Sout of the bootstrap circuit 20 (Vout=2×Vdd). Since the voltage Vin' at the inverting input terminal Sin' of the bootstrap circuit 20 is at the high voltage level, the second charging path and the fourth charging path are turned on. Consequently, the second bootstrap capacitor $C_{B2}$ is charged to the capacitor voltage. Under this circumstance, since the second discharging path is turned on, electrical charges are discharged from the inverting output terminal Sout' of the bootstrap circuit 20 through the second discharging path, and the second high voltage providing path is turned off.

The discharging path providing circuit 203 includes the third N-type transistor N3 and the fourth N-type transistor N4. When the third N-type transistor N3 is turned on, the output terminal Sout of the bootstrap circuit 20 is connected with the ground terminal Vss, and electrical charges are discharged to the ground voltage (i.e. the voltage at the ground terminal). Consequently, the third N-type transistor N3 may be considered as a third discharging path. When the fourth N-type transistor N4 is turned on, the inverting output terminal Sout' of the bootstrap circuit 20 is connected with the ground terminal Vss, and electrical charges are discharged to the ground voltage. Consequently, the fourth N-type transistor N4 may be considered as a fourth discharging path.

The third discharging path is electrically connected between the ground terminal Vss and the output terminal Sout of the bootstrap circuit 20. The on/off statuses of the third discharging path are controlled according to the voltage Vout' at the inverting output terminal Sout' of the bootstrap circuit 20. In a case that the voltage at the inverting output terminal Sout' of the bootstrap circuit 20 is equal to the second superimposed voltage (Vout'=2×Vdd), the third discharging path is turned on, so that the output terminal Sout of the bootstrap circuit 20 discharges electrical charges to the ground terminal through the third discharging path (i.e. Vout=Vss=0 volt).

The fourth discharging path is electrically connected between the ground terminal Vss and the inverting output terminal Sout' of the bootstrap circuit 20. The on/off statuses of the fourth discharging path are controlled according to the voltage Vout at the output terminal Sout of the bootstrap circuit 20. In a case that the voltage at the output terminal Sout of the bootstrap circuit 20 is equal to the first superimposed voltage (Vout=2×Vdd), the fourth discharging path is turned on, so that the inverting output terminal Sout' of the bootstrap circuit 20 discharges electrical charges to the ground terminal through the fourth discharging path (Vout'=Vss=0 volt).

Figure 3A:
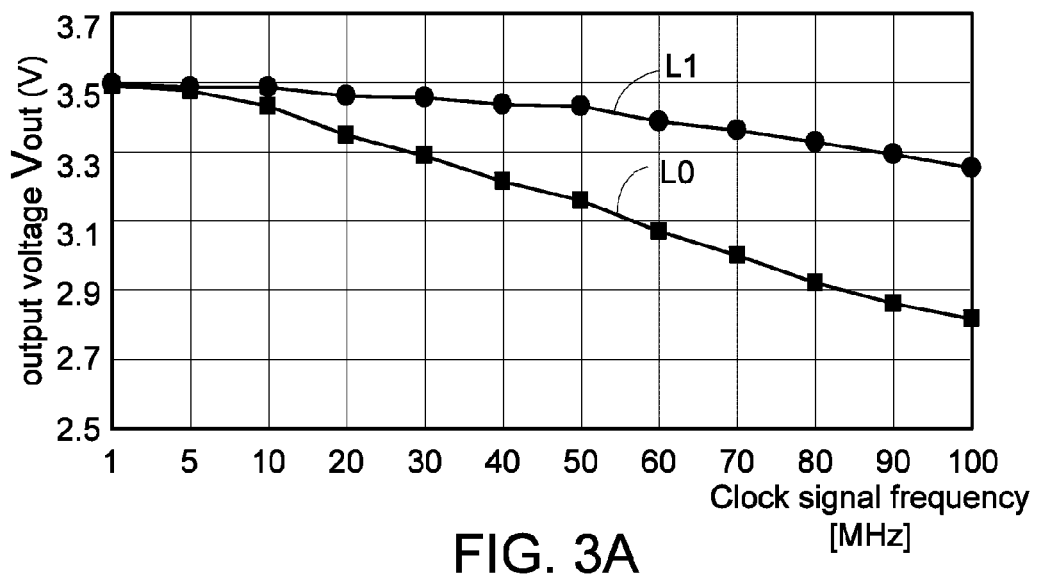
FIG. 3A is a comparison plot illustrating the relationship between the output voltage of the bootstrap circuit and the frequency of the clock signal.
Figure 3B:
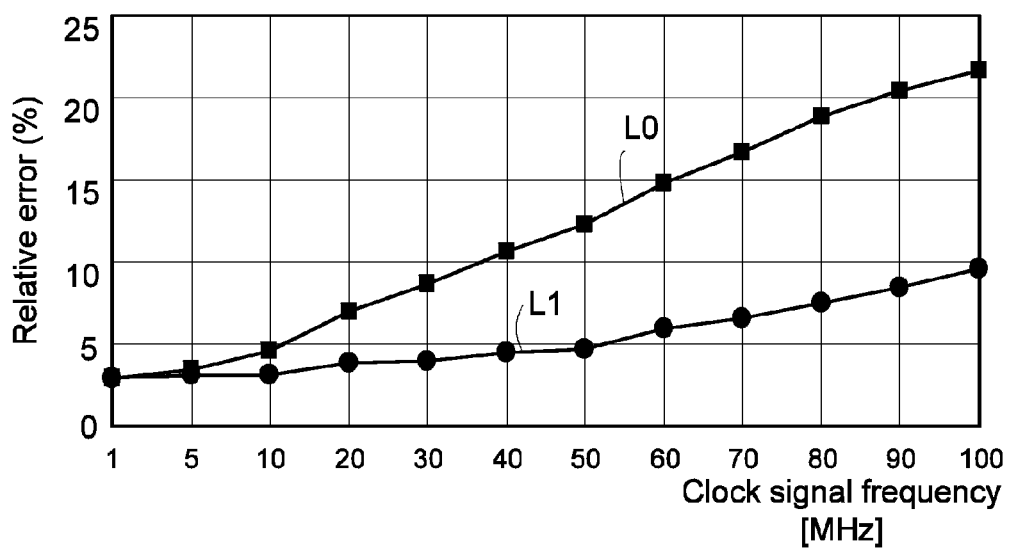
FIG. 3B is a comparison plot illustrating the relationship between the relative error of the output voltage of the bootstrap circuit and the frequency of the clock signal.

FIG. 3A is a comparison plot illustrating the relationship between the output voltage of the bootstrap circuit and the frequency of the clock signal. FIG. 3B is a comparison plot illustrating the relationship between the relative error of the output voltage of the bootstrap circuit and the frequency of the clock signal.

In FIGS. 3A and 3B, the curves L0 indicate the operation of the conventional bootstrap circuit, and the curves L1 indicate the operation of the bootstrap circuit of FIG. 2A.

It is assumed that the bootstrap capacitor $C_{B1}$ of the conventional bootstrap circuit, and the first bootstrap capacitor $C_{B1}$ and the second bootstrap capacitor $C_{B2}$ of the bootstrap circuit of the present invention are identical (e.g. $C_{B1}=C_{B2}=5$ pF). The load capacitance $C_L$ is assumed to be 0.15 pF, and the high voltage level Vdd of the clock signal CLK is 1.8 volt.

Please refer to FIG. 3A. In a case that the frequency of the clock signal CLK is 1 MHz, the voltages Vout at the output terminals Sout of the conventional bootstrap circuit 10 and the bootstrap circuit 20 are both larger than 3.5 volts. In a case that the frequency of the clock signal CLK is 100 MHz, the voltage Vout at the output terminal Sout of the conventional bootstrap circuit 10 is about 2.8 volt, and the voltage Vout at the output terminal Sout of the bootstrap circuit 20 is about 3.3 volts.

For clearly comparing the difference between the ideal value and the simulated value of the voltage Vout at the output terminal Sout of the bootstrap circuit, a relative error may be calculated by the following equation (2).

$$\text{relative error} = \frac{V_{out,ideal} - V_{out,sim}}{V_{out,ideal}} = \frac{2V_{DD} - V_{out,sim}}{2V_{DD}} \quad (2)$$

Please refer to FIG. 3B. In a case that the frequency of the clock signal CLK is 1 MHz, the relative error of the conventional bootstrap circuit 10 and the relative error of the bootstrap circuit 20 are very low. In a case that the frequency of the clock signal CLK is 100 MHz, the relative error of the conventional bootstrap circuit 10 is 20%, but the relative error of the bootstrap circuit 20 is 10%.

In other words, in a case that the frequency of the clock signal CLK is 1 MHz, the conventional bootstrap circuit 10 and the bootstrap circuit 20 have the same efficiency. However, as the frequency of the clock signal CLK is increased, the voltage Vout at the output terminal Sout of the conventional bootstrap circuit 10 is obviously decreased, and the relative error is increased.

Please refer to FIGS. 3A and 3B again. In a case that the frequency of the clock signal CLK is 100 MHz, the voltage Vout at the output terminal Sout of the conventional bootstrap circuit 10 is obviously decreased by 500 mV and the relative error is increased to 22%. In a case that the frequency of the clock signal CLK is 100 MHz, the voltage Vout at the output terminal Sout of the bootstrap circuit 20 is decreased by only about 200 mV and the relative error is decreased to be lower than 10%.

Figure 3C:
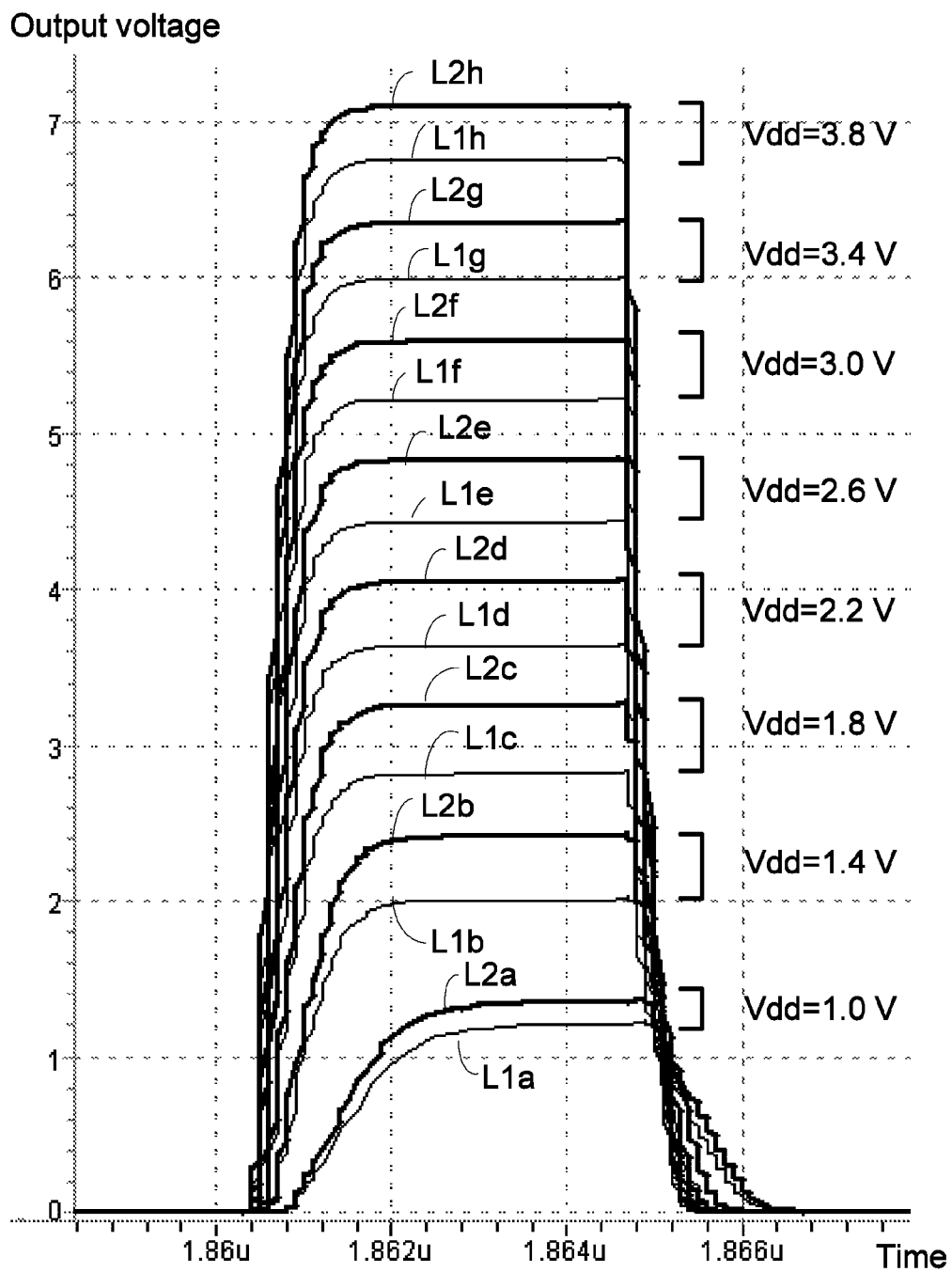
FIG. 3C is a comparison plot illustrating the relationship between the response time, the output voltage and the input voltage of the bootstrap circuit in response to different magnitudes of the high voltage level of the clock signal CLK.

FIG. 3C is a comparison plot illustrating the response time of the output voltages corresponding to the input clock signals CLK with different magnitudes of high voltage levels. In FIG. 3C, the frequency of the clock signal CLK is 100 MHz. In FIG. 3C, the curves L1a~L1h indicate the voltage levels of the output voltage of the conventional bootstrap circuit, and the curves L2a~L2h indicate the voltage levels of the output voltage of the bootstrap circuit of FIG. 2A.

The curve L1a and the curve L2a indicate that the high voltage level of the clock signal CLK is 1.0 volt. The curve L1b and the curve L2b indicate that the high voltage level of the clock signal CLK is 1.4 volt. The curve L1c and the curve L2c indicate that the high voltage level of the clock signal CLK is 1.8 volt. The curve L1d and the curve L2d indicate that the high voltage level of the clock signal CLK is 2.2 volt. The curve L1e and the curve L2e indicate that the high voltage level of the clock signal CLK is 2.6 volt. The curve L1f and the curve L2f indicate that the high voltage level of the clock signal CLK is 3.0 volt. The curve L1g and the curve L2g indicate that the high voltage level of the clock signal CLK is 3.4 volt. The curve L1h and the curve L2h indicate that the high voltage level of the clock signal CLK is 3.8 volt.

As shown in FIG. 3C, the rising speed of the output voltage shown by the curve Da is slower than that of the curve L2a. Moreover, the output voltage of the curve L2a is lower than that of the curve L2b. The rest may be deduced by analogy. That is, the output voltage of the bootstrap circuit of the present invention is higher than the conventional bootstrap circuit and close to the ideal value. Moreover, the response speed of the output voltage of the bootstrap circuit of the present invention is faster than the conventional bootstrap circuit. In other words, by using the bootstrap circuit of the present invention, the influence of the load capacitance on the output terminal of the bootstrap circuit will be reduced.

Please refer to FIG. 3C again. As the high voltage level of the clock signal CLK is increased, the high voltage level of the output voltage Vout of the bootstrap circuit is closer to 2×Vdd. Consequently, as the high voltage level of the clock signal CLK is increased, the relative error of the output voltage Vout is decreased.

For example, in a case that the high voltage level of the clock signal CLK is 1.4 volt, the output voltage Vout of the curve L1b is about 2.0 volts, and the output voltage Vout of the curve L2b is about 2.2 volts. Both of these two values are not equal to the ideal value (i.e. 1.4×2=2.8 volts).

The relative error between the real output voltage and the ideal output voltage for the curve L1b is about 28.6% (i.e. (2.8−2.0)/2.8≈28.6%). The relative error between the real output voltage and the ideal output voltage for the curve L2b is about 21.4% (i.e. (2.8−2.2)/2.8≈21.4%).

On the other hand, in a case that the high voltage level of the clock signal CLK is 3.8 volt, the output voltage of the curve L1h is about 6.8 volts, and the output voltage of the curve L2h is about 7.2 volts. Both of these two values are not equal to the ideal value (i.e. 3.8×2=7.6 volts).

The relative error between the real output voltage and the ideal output voltage for the curve L1h is about 10.5% (i.e. (7.6−6.8)/7.6≈10.5%). The relative error between the real output voltage and the ideal output voltage for the curve L2h is about 5.3% (i.e. (7.6−7.2)/7.6≈5.3%).

From the above discussions, it is found that the efficiency of the bootstrap circuit is increased as the input voltage Vin is increased. In a case that the high voltage level of the clock signal CLK is lower, the difference between the output voltage and 2×Vdd is higher. In other words, if the high voltage level of the clock signal CLK is lower, the behaviors of the bootstrap circuit are more non-ideal.

Figure 4A:
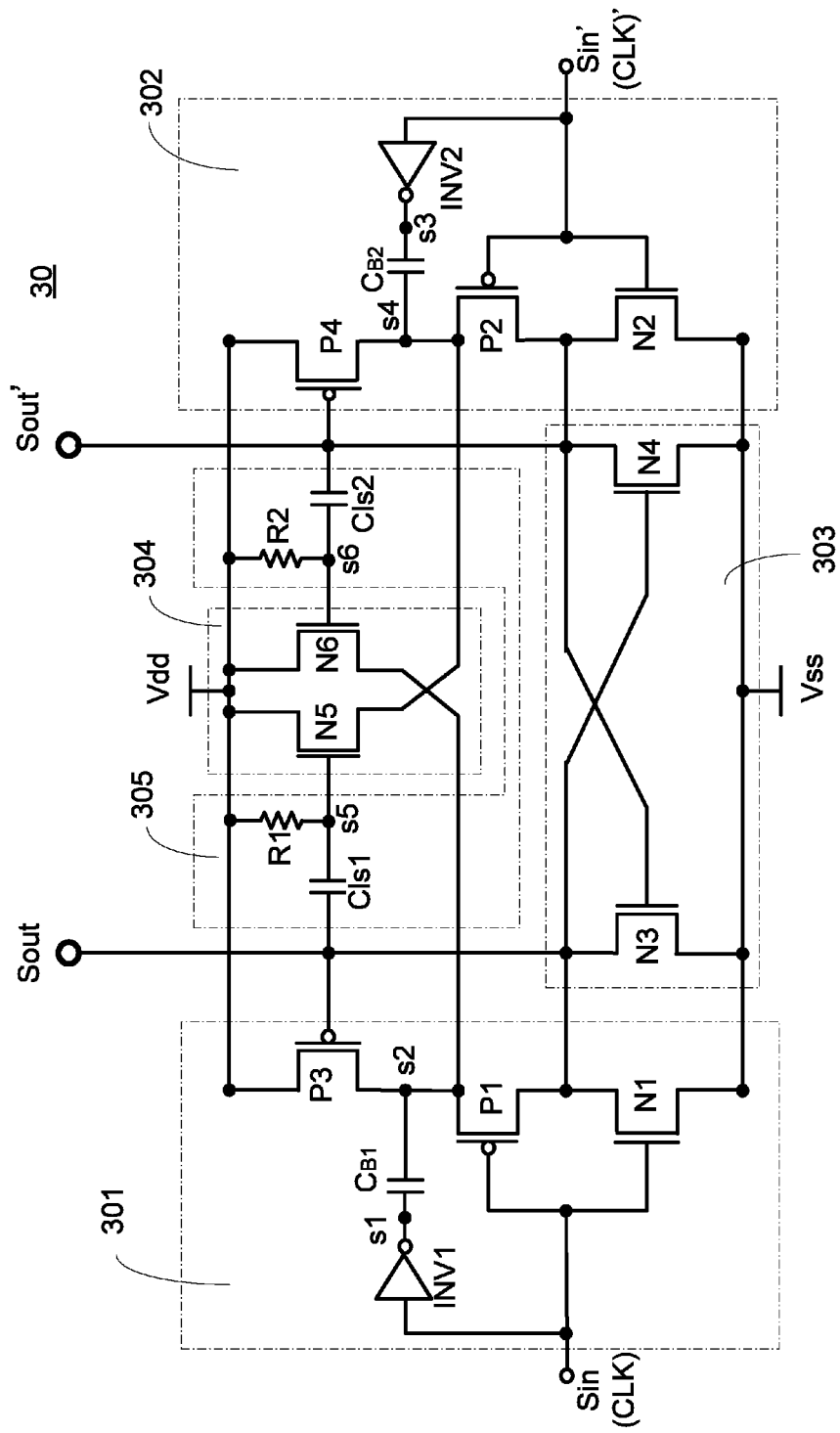
FIG. 4A schematically illustrates a bootstrap circuit according to a second embodiment of the present invention.

FIG. 4A schematically illustrates a bootstrap circuit according to a second embodiment of the present invention. The bootstrap circuit 30 includes a first sub-bootstrap circuit 301, a second sub-bootstrap circuit 302, a discharging path providing circuit 303, a charging path providing circuit 304, and a level shifter circuit 305. The configurations and operations of the first sub-bootstrap circuit 301, the second sub-bootstrap circuit 302, the discharging path providing circuit 303 and the charging path providing circuit 304 are similar to those of the bootstrap circuit as shown in FIG. 2A, and are not redundantly described herein.

In this embodiment, the controlling mechanism of the charging path providing circuit 304 is affected by the level shifter circuit 305. The charging path providing circuit 304 includes a fifth N-type transistor N5 and a sixth N-type transistor N6. The charging path providing circuit 304 is electrically connected with the first sub-bootstrap circuit 301 and the second sub-bootstrap circuit 302 through the level shifter circuit 305.

The level shifter circuit 305 includes two portions. The first portion of the level shifter circuit 305 is arranged between the first sub-bootstrap circuit 301 and the charging path providing circuit 304, and includes a first resistor R1 and a first level shifter capacitor Cls1. The second portion of the level shifter circuit 305 is arranged between the second sub-bootstrap circuit 302 and the charging path providing circuit 304, and includes a second resistor R2 and a second level shifter capacitor Cls2.

A first end of the first resistor R1 is electrically connected with the power voltage Vdd and the drain terminal of the fifth N-type transistor N5. As second end of the first resistor R1 and a first end of the first level shifter capacitor Cls1 are electrically connected with the gate terminal of the fifth N-type transistor N5. A second end of the first level shifter capacitor Cls1 is electrically connected with the output terminal Sout of the bootstrap circuit 20.

Moreover, the second end of the first resistor R1, the first end of the first level shifter capacitor Cls1 and the gate terminal of the fifth N-type transistor N5 are electrically connected with a fifth node s5.

A first end of the second resistor R2 is electrically connected with the power voltage Vdd and the drain terminal of the sixth N-type transistor N6. A second end of the second resistor R2 and a first end of the second level shifter capacitor Cls2 are electrically connected with the gate terminal of the sixth N-type transistor N6. A second end of the second level shifter capacitor Cls2 is electrically connected with the inverting output terminal Sout' of the bootstrap circuit 30.

Moreover, the second end of the second resistor R2, the first end of the second level shifter capacitor Cls2 and the gate terminal of the sixth N-type transistor N6 are electrically connected with a sixth node s6.

Except for the level shifter circuit 305, the configurations of the bootstrap circuit 30 of FIG. 4A are similar to those of the bootstrap circuit 20 of FIG. 2A. Consequently, only the influences of the level shifter circuit 305 will be illustrated as follows.

As shown in FIG. 4A, even if the level shifter circuit 305 is additionally included in the bootstrap circuit 30, the connection between the first sub-bootstrap circuit 301 and the second sub-bootstrap circuit 302 is not changed.

In other words, the behaviors of the first sub-bootstrap circuit 301 and the second sub-bootstrap circuit 302 are similar to those of the bootstrap circuit 20. The waveforms of the voltages at the input terminal Sin, the output terminal Sout, the first node s1 and the second node s2 of the first sub-bootstrap circuit 301 during the first time period T1 and during the second time period T2 are similar to the first, second, third and fourth waveforms of FIG. 2B. The waveforms of the voltages at the inverting input terminal Sin', the inverting output terminal Sout', the third node s3 and the fourth node s4 of the second sub-bootstrap circuit 302 during the first time period T1 and the second time period T2 are similar to the fifth, sixth, seventh and eighth waveforms of FIG. 2B.

Figure 4B:
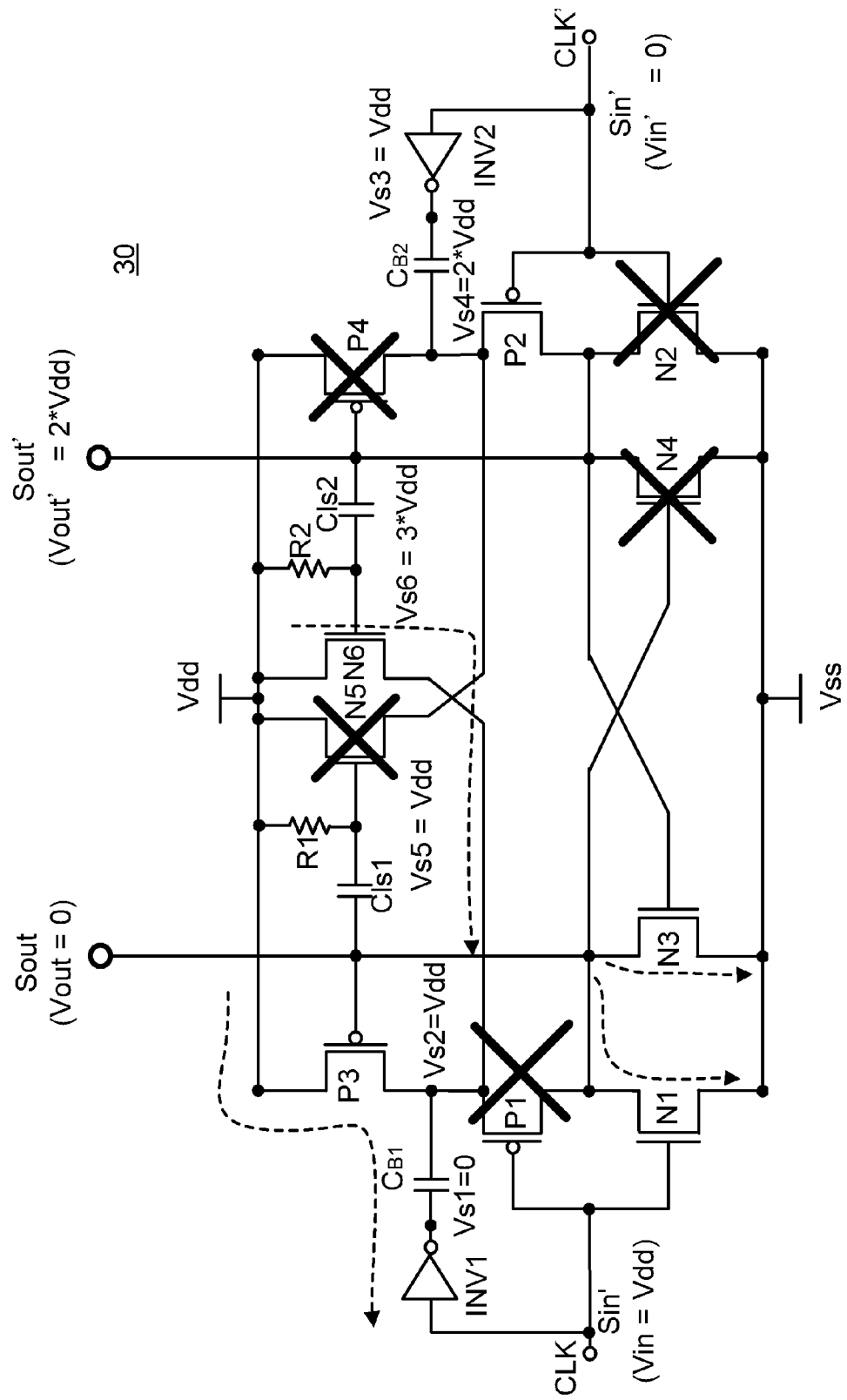
FIG. 4B schematically illustrates the on/off statuses of the transistors of the bootstrap circuit of FIG. 4A in response to the high voltage level of the clock signal.

FIG. 4B schematically illustrates the on/off statuses of the transistors of the bootstrap circuit of FIG. 4A in response to the high voltage level of the clock signal. The operations of the first sub-bootstrap circuit 301 and the second sub-bootstrap circuit 302 during the first time period T1 are similar to those of the bootstrap circuit 20, and are not redundantly described herein. Moreover, the behaviors of the discharging path providing circuit 303 are similar to those of FIG. 2C, and are not redundantly described herein.

From the above discussions, the fifth N-type transistor N5 of the charging path providing circuit 304 is controlled by the first portion of the level shifter circuit 305, and the sixth N-type transistor N6 of the charging path providing circuit 304 is controlled by the second portion of the level shifter circuit 305. In particular, the fifth N-type transistor N5 is controlled according to the voltage Vs5 at the fifth node s5, and the sixth N-type transistor N6 is controlled according to the voltage Vs6 at the sixth node s6.

During the first time period T1, the voltage of the clock signal CLK is at the high voltage level Vdd, and the voltage at the output terminal Sout of the bootstrap circuit 30 is at the low voltage level Vss (0 volt). Since the fifth node s5 of the level shifter circuit 305 is electrically connected with the power voltage through the first resistor R1, the voltage Vs5 at the fifth node s5 of the level shifter circuit 305 is equal to Vdd. Consequently, the first level shifter capacitor Cls1 is charged during the first time period T1, and the voltage difference between the two ends of the first level shifter capacitor Cls1 is equal to Vdd.

Moreover, since the voltage Vout' at the inverting output terminal Sout' of the bootstrap circuit 30 is equal to 2×Vdd, the voltage Vs6 at the sixth node s6 is equal to the sum of the voltage Vout' at the inverting output terminal Sout' of the bootstrap circuit 30 and one Vdd. In other words, the voltage Vs6 at the sixth node s6 is equal to 3×Vdd.

Moreover, the voltage at the fifth node is equal to Vdd, the voltage at the drain terminal and the gate terminal of the fifth N-type transistor N5 of the charging path providing circuit 304 are both equal to Vdd, and the voltage at the source terminal of the fifth N-type transistor N5 is equal to 2×Vdd. Consequently, as shown in FIG. 4B, the fifth N-type transistor N5 is turned off during the first time period T1.

Moreover, since the voltage Vs6 at the sixth node s6 is equal to 3×Vdd, the voltage at the drain terminal of the sixth N-type transistor N6 of the charging path providing circuit 304 is equal to Vdd, the voltage at the gate terminal of the sixth N-type transistor N6 is equal to 3×Vdd, and the voltage at the source terminal of the sixth N-type transistor N6 is equal to Vdd. Consequently, as shown in FIG. 4B, the sixth N-type transistor N6 is turned on during the first time period T1.

In other words, even if the bootstrap circuit 30 further includes the level shifter circuit 305, the on/off statuses of the transistors of the charging path providing circuit 304 during the first time period T1 are similar to those of the bootstrap circuit 20 of FIG. 2C except that the voltage levels at the electrodes of the fifth N-type transistor N5 and the sixth N-type transistor N6 are distinguished.

Figure 4C:
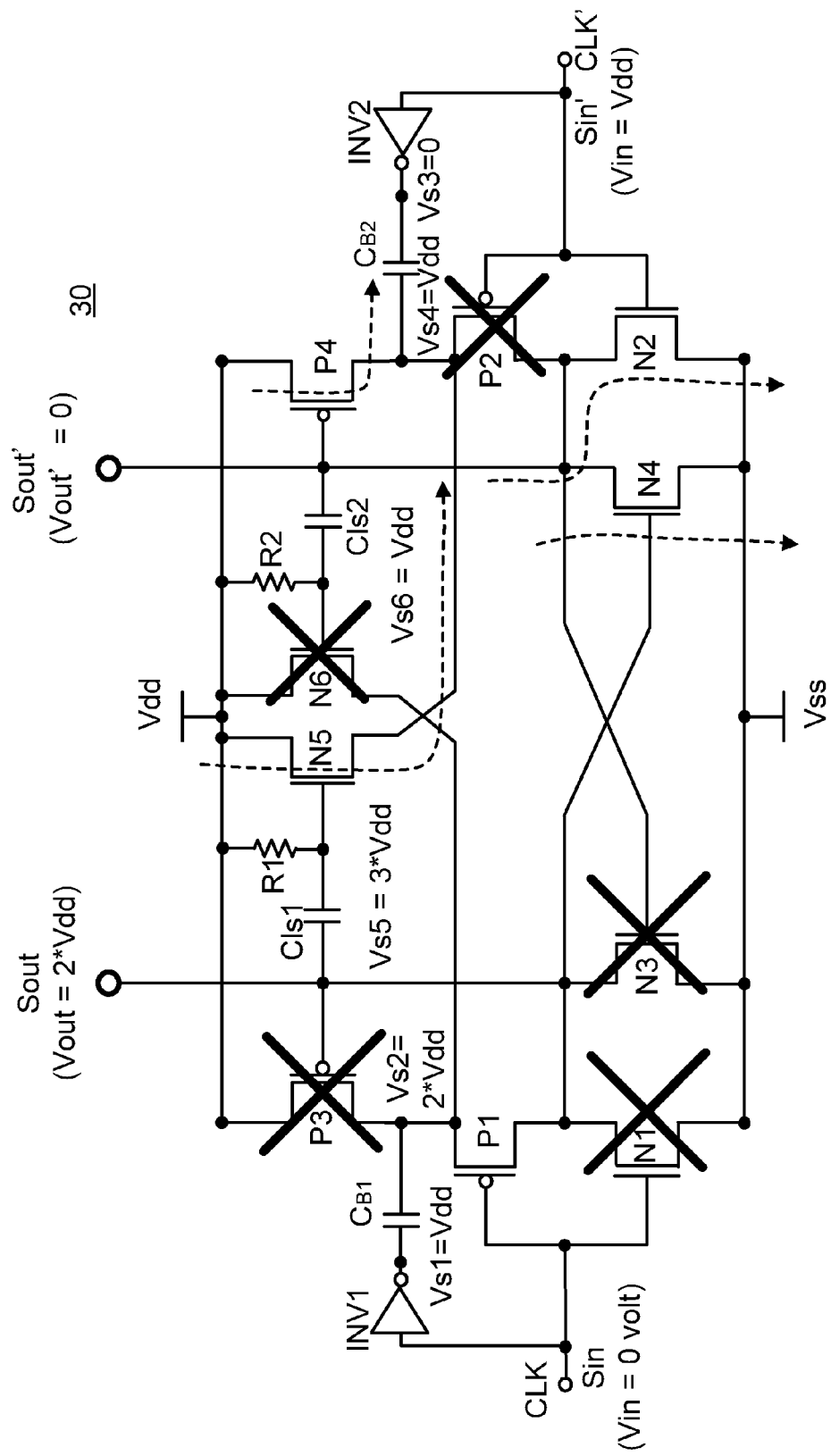
FIG. 4C schematically illustrates the on/off statuses of the transistors of the bootstrap circuit of FIG. 4A in response to the low voltage level of the clock signal.

FIG. 4C schematically illustrates the on/off statuses of the transistors of the bootstrap circuit of FIG. 4A in response to the low voltage level of the clock signal. The operations of the first sub-bootstrap circuit 301 and the second sub-bootstrap circuit 302 during the second time period T2 are similar to those of the bootstrap circuit 20, and are not redundantly described herein. Moreover, the behaviors of the discharging path providing circuit 303 are similar to those of FIG. 2D, and are not redundantly described herein.

During the second time period T2, the voltage of the clock signal CLK is at the low voltage level Vss, and the voltage at the output terminal Sout of the bootstrap circuit 30 is equal to 2×Vdd. Since the voltage difference between the two ends of the first level shifter capacitor Cls1 is equal to Vdd, the voltage Vs5 at the fifth node s5 of the level shifter circuit 305 during the second time period T2 is equal to 3×Vdd.

Moreover, the voltage at the inverting output terminal Sout' of the bootstrap circuit 30 is at the low voltage level Vss, and the first end of the second resistor R2 is electrically connected with the power voltage Vdd. Consequently, the voltage Vs6 at the sixth node s6 is equal to the power voltage Vdd. Since the first end and the second end of the second level shifter capacitor Cls2 are connected with the sixth node s6 and the inverting output terminal Sout' of the bootstrap circuit 30, the second level shifter capacitor Cls2 is charged by the power voltage Vdd through the second resistor R2 during the second time period T2.

From the above discussions, during the second time period T2, the voltage Vs5 at the fifth node s5 of the level shifter circuit 305 is equal to 3×Vdd. The voltage at the drain terminal of the fifth N-type transistor N5 of the charging path providing circuit 304 is equal to Vdd, and the voltage at the source terminal of the fifth N-type transistor N5 is equal to Vss. Consequently, as shown in FIG. 4C, the fifth N-type transistor N5 is turned on during the second time period T2.

Moreover, during the second time period T2, the voltage Vs6 at the sixth node s6 of the level shifter circuit 305 is equal to 2×Vdd. The voltage at the drain terminal of the sixth N-type transistor N6 of the charging path providing circuit 304 is equal to Vdd, the voltage at the gate terminal of the sixth N-type transistor N6 is equal to Vdd, and the voltage at the source terminal of the sixth N-type transistor N6 is equal to 2×Vdd. Consequently, the sixth N-type transistor N6 is turned off during the second time period T2.

In other words, even if the bootstrap circuit 30 further includes the level shifter circuit 305, the on/off statuses of the transistors of the charging path providing circuit 304 during the second time period T2 are similar to those of the bootstrap circuit 20 of FIG. 2D except that the voltage levels at the electrodes of the fifth N-type transistor N5 and the sixth N-type transistor N6 are distinguished.

Please refer to FIGS. 4B and 4C again. During the first time period T1, since the voltage at the output terminal Sout of the bootstrap circuit 30 is decreased and the voltage at the second node s2 is increased to the high voltage level, the voltage at the gate terminal of the sixth N-type transistor N6 is increased to 3×Vdd. Under this circumstance, the voltage difference VGS between the gate terminal and the source terminal of the sixth N-type transistor N6 is equal to 2×Vdd. Consequently, the sixth N-type transistor N6 can be turned on more efficiently, and a current will flow through the sixth N-type transistor N6 to charge the first bootstrap capacitor $C_{B1}$.

During the second time period T2, the voltage at the gate terminal of the sixth N-type transistor N6 is equal to Vdd, and the output voltage is equal to 2×Vdd. Consequently, the voltage difference between the gate terminal and the source terminal of the sixth N-type transistor N6 is equal to −Vdd.

In other words, only when the voltage at the output terminal Sout of the bootstrap circuit 30 is equal to Vss, the first sub-bootstrap circuit 301 is influenced by the sixth N-type transistor N6 of the charging path providing circuit 304.

From the above discussions, the bootstrap circuit 30 of this embodiment further includes a level shifter circuit 305. The level shifter circuit 305 includes a first resistor R1, a first level shifter capacitor Cls1, a second resistor R2, and a second level shifter capacitor Cls2. The voltages at the gate terminals of the fifth N-type transistor N5 and the sixth N-type transistor N6 are increased from 2×Vdd (in the above embodiment) to 3×Vdd. Consequently, after the fifth N-type transistor N5 and the sixth N-type transistor N6 are turned on, the response speed is enhanced.

In a case that the voltage Vout at the output terminal Sout of the bootstrap circuit 30 is at the low voltage level, the first level shifter capacitor Cls1 is charged by the power voltage Vdd through the first resistor R1. Consequently, the voltage difference between the two ends of the first level shifter capacitor Cls1 is equal to Vdd (i.e. a first level shift voltage). As the voltage Vout at the output terminal Sout of the bootstrap circuit 30 is increased to the high voltage level (2×Vdd), the voltage Vs5 at the fifth node s5 is increased to 3×Vdd. Consequently, the fifth N-type transistor N5 (i.e. the fourth charging path) is turned on. In other words, the on/off statuses of the fifth N-type transistor N5 are determined according to the sum of the output voltage Vout and the first level shift voltage Vdd.

Whereas, in a case that the voltage Vout' at the inverting output terminal Sout' of the bootstrap circuit 30 is at the low voltage level, the second level shifter capacitor Cls2 is charged by the power voltage Vdd through the second resistor R2. Consequently, the voltage difference between the two ends of the second level shifter capacitor Cls2 is equal to Vdd (i.e. a second level shift voltage). As the voltage Vout' at the inverting output terminal Sout' of the bootstrap circuit 30 is increased to the high voltage level (2×Vdd), the voltage Vs6 at the sixth node s6 is increased to 3×Vdd. Consequently, the sixth N-type transistor N6 (i.e. the third charging path) is turned on. In other words, the on/off statuses of the sixth N-type transistor N6 are determined according to the sum of the inverting output voltage Vout' and the second level shift voltage Vdd.

Figure 5:
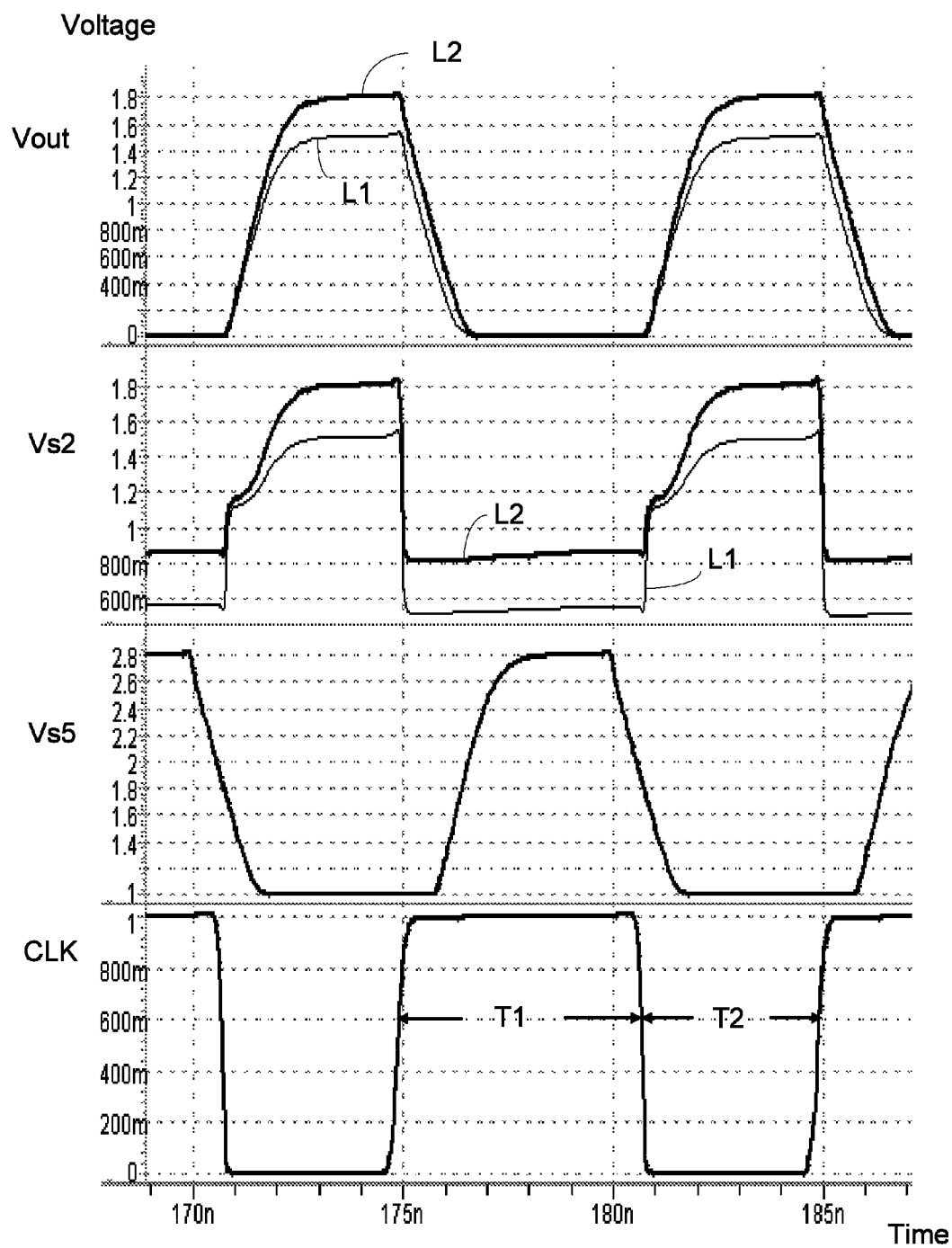
FIG. 5 is a schematic timing waveform diagram illustrating associated voltage signals processed in the bootstrap circuits of FIG. 2A and FIG. 4A.

FIG. 5 is a schematic timing waveform diagram illustrating associated voltage signals processed in the bootstrap circuits of FIG. 2A and FIG. 4A.

As shown in FIG. 5, the first waveform denotes the change of the voltage Vout at the output terminal Sout of the bootstrap circuit. In particular, the curve L1 indicates those of the bootstrap circuit of FIG. 2A, and the curve L2 indicates those of the bootstrap circuit of FIG. 4A.

As shown in FIG. 5, the second waveform denotes the change of the voltage Vs2 at the second node s2. In particular, the curve L1 indicates that of the bootstrap circuit of FIG. 2A, and the curve L2 indicates that of the bootstrap circuit of FIG. 4A.

As shown in FIG. 5, the third waveform denotes the change of the voltage Vs5 at the fifth node s5. Since the level shifter circuit 305 is not included in the bootstrap circuit of FIG. 2A, a single curve indicates the change of the voltage Vs5 at the fifth node s5 of the bootstrap circuit of FIG. 4A.

As shown in FIG. 5, the fourth waveform denotes the change of the clock signal CLK. It is assumed that the clock signal CLK inputted into the bootstrap circuit of FIG. 2A and the clock signal CLK inputted into the bootstrap circuit of FIG. 4A are identical. For example, the voltage level of the clock signal CLK is 1 volt during the first time period T1 and 2 volts during the second time period T2.

The behaviors of the bootstrap circuit of FIG. 2A during the first time period T1 may be illustrated with reference to FIG. 2C. The voltage Vs2 at the second node s2 during the first time period T1 is equal to Vdd, and the voltage Vout at the output terminal of the bootstrap circuit is 0 volt. The behaviors of the bootstrap circuit of FIG. 4A during the first time period T1 may be illustrated with reference to FIG. 4B. The voltage Vs2 at the second node s2 during the first time period T1 is equal to Vdd, and the voltage Vout at the output terminal of the bootstrap circuit 30 is 0 volt.

Please refer to FIG. 5. During the first time period T1, the output voltage Vout of the bootstrap circuit of FIG. 2A and the output voltage Vout of the bootstrap circuit of FIG. 4A are both close to 0 volt. However, the voltage Vs2 at the second node s2 of the bootstrap circuit of FIG. 2A (curve L1) and the voltage Vs2 at the second node s2 of the bootstrap circuit of FIG. 4A (curve L2) are not ideally equal to Vdd (e.g. Vdd=1 volt). That is, the voltage Vs2 at the second node s2 of the bootstrap circuit of FIG. 2A (curve L1) is about 500 mV, and the voltage Vs2 at the second node s2 of the bootstrap circuit of FIG. 4A (curve L2) is about 800 mV.

The behaviors of the bootstrap circuit of FIG. 2A during the second time period T2 may be illustrated with reference to FIG. 2D. The voltage Vs2 at the second node s2 during the second time period T2 is equal to 2×Vdd, and the voltage Vout at the output terminal of the bootstrap circuit is equal to 2×Vdd. The behaviors of the bootstrap circuit of FIG. 4A during the second time period T2 may be illustrated with reference to FIG. 4C. The voltage Vs2 at the second node s2 during the second time period T2 is equal to 2×Vdd, and the voltage Vout at the output terminal of the bootstrap circuit 30 is equal to 2×Vdd.

Please refer to FIG. 5. During the second time period T2, the output voltage Vout of the bootstrap circuit of FIG. 2A and the output voltage Vout of the bootstrap circuit of FIG. 4A are not ideally equal to 2×Vdd (2×Vdd=2 volts). That is, the output voltage Vout of the bootstrap circuit of FIG. 2A (curve L1) is about 1.5 volt, and the output voltage Vout of the bootstrap circuit of FIG. 4A (curve L2) is about 1.8 volt.

Moreover, during the second time period T2, the voltage Vs2 at the second node s2 of the bootstrap circuit of FIG. 2A (curve L1) and the voltage Vs2 at the second node s2 of the bootstrap circuit of FIG. 4A (curve L2) are not ideally equal to 2×Vdd. The voltage Vs2 at the second node s2 of the bootstrap circuit of FIG. 2A (curve L1) is abruptly increased and then maintained at about 1.5 volt, and the voltage Vs2 at the second node s2 of the bootstrap circuit of FIG. 4A (curve L2) is abruptly increased and then maintained at about 1.8 volt.

Figure 6A:
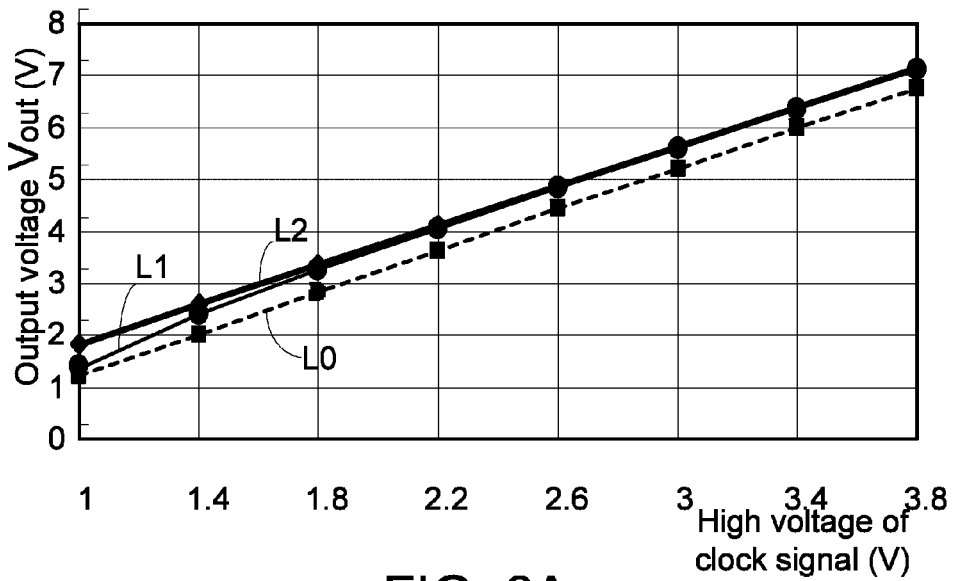
FIG. 6A is a comparison plot illustrating the relationship between the output voltage of the bootstrap circuit and the high voltage level of the clock signal.

FIG. 6A is a comparison plot illustrating the relationship between the output voltage of the bootstrap circuit and the high voltage level of the clock signal. In FIG. 6A, the curve L0 indicates the relationship between the output voltage Vout of the conventional bootstrap circuit and the high voltage level of the clock signal CLK. The curve L1 indicates the relationship between the output voltage Vout of the bootstrap circuit of FIG. 2A and the high voltage level of the clock signal CLK. And, the curve L2 indicates the relationship between the output voltage Vout of the bootstrap circuit of FIG. 4A and the high voltage level of the clock signal CLK.

Please refer to FIG. 6A. In a case that the high voltage level of the clock signal CLK is lower, the output voltage Vout of the bootstrap circuit of FIG. 4A is the closest to 2×Vdd. In other words, the use of the level shifter circuit can further enhance the performance of the bootstrap circuit.

Figure 6B:
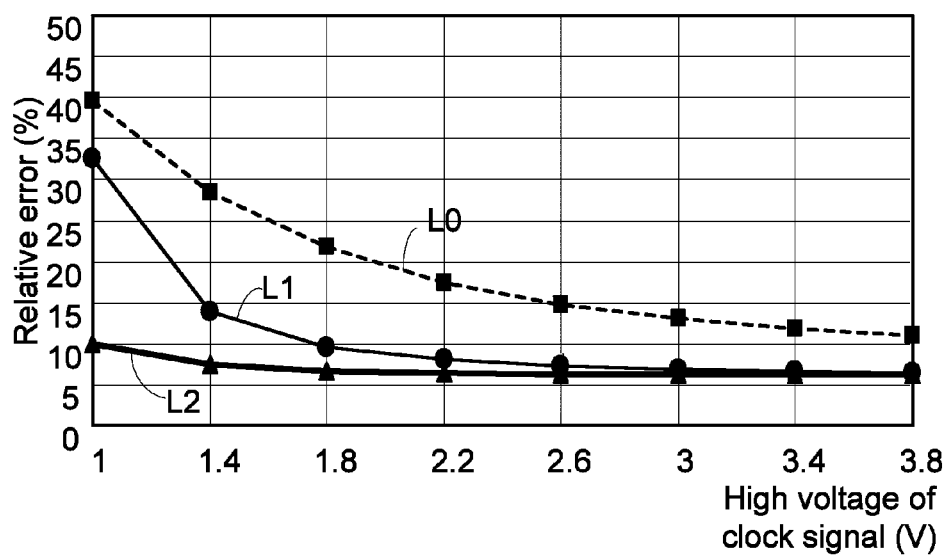
FIG. 6B is a comparison plot illustrating the relationship between the relative error of the output voltage of the bootstrap circuit and the high voltage level of the clock signal.

FIG. 6B is a comparison plot illustrating the relationship between the relative error of the output voltage of the bootstrap circuit and the high voltage level of the clock signal.

In FIG. 6B, the curve L0 indicates the relationship between the relative error of the output voltage Vout of the bootstrap circuit and the high voltage level of the clock signal in the conventional bootstrap, the curve L1 indicates that in the bootstrap circuit of FIG. 2A, and the curve L2 indicates that in the bootstrap circuit of FIG. 4A. Please refer to FIG. 6B. In a case that the high voltage level of the clock signal CLK is lower, the output voltage Vout of the bootstrap circuit of FIG. 4A is the closest to the ideal output voltage.

From FIG. 6B, it is found that the use of the level shifter circuit can obviously enhance the performance of the bootstrap circuit. In a case that the frequency of the clock signal CLK is 100 MHz and the high voltage level of the clock signal CLK is 1 volt, the output voltage Vout of the bootstrap circuit is about 1.8 volt, and the relative error of the bootstrap circuit with the level shifter circuit is about 9.883%. As the high voltage level of the clock signal CLK is increased, influence of the level shifter circuit is gradually decreased because of the third P-type transistor P3.

From the above description, the bootstrap circuit of the present invention utilizes a charging path providing circuit to accelerate the speed of charging the bootstrap capacitor. Consequently, the delaying time is shortened and the response speed of the output voltage is increased. Under this circumstance, the high-frequency applications of the bootstrap circuit of the present invention will be expanded.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bootstrap circuit having an input terminal, an inverting input terminal, an output terminal and an inverting output terminal, the bootstrap circuit comprising:
   a first sub-bootstrap circuit, comprising a first inverter, a first bootstrap capacitor, a first charging path, a first discharging path, and a first high voltage providing path, wherein an input terminal of the first inverter is electrically connected with the input terminal of the bootstrap circuit, an output terminal of the first inverter is electrically connected with a first end of the first bootstrap capacitor, the first charging path is electrically connected between a second end of the first bootstrap capacitor and a power voltage, the first high voltage providing path is electrically connected between the second end of the first bootstrap capacitor and the output terminal of the bootstrap circuit, and the first discharging path is electrically connected between the output terminal of the bootstrap circuit and a ground terminal, wherein the first discharging path and the first high voltage providing path are controlled according to a voltage at the input terminal of the bootstrap circuit, and the first charging path is controlled according to a voltage at the output terminal of the bootstrap circuit;

a second sub-bootstrap circuit, comprising a second inverter, a second bootstrap capacitor, a second charging path, a second discharging path, and a second high voltage providing path, wherein an input terminal of the second inverter is electrically connected with the inverting input terminal of the bootstrap circuit, an output terminal of the second inverter is electrically connected with a first end of the second bootstrap capacitor, the second charging path is electrically connected between a second end of the second bootstrap capacitor and the power voltage, the second high voltage providing path is electrically connected between the second end of the second bootstrap capacitor and the inverting output terminal of the bootstrap circuit, and the second discharging path is electrically connected between the inverting output terminal of the bootstrap circuit and the ground terminal, wherein the second discharging path and the second high voltage providing path are controlled according to a voltage at the inverting input terminal of the bootstrap circuit, and the second charging path is controlled according to a voltage at the inverting output terminal of the bootstrap circuit; and a charging path providing circuit, comprising a third charging path, wherein the third charging path is electrically connected between the power voltage and the second end of the first bootstrap capacitor, and the third charging path is controlled according to the voltage at the inverting output terminal of the bootstrap circuit, wherein in response to a high voltage level inputted into the input terminal of the bootstrap circuit, the first charging path and the third charging path are turned on, the first bootstrap capacitor is charged to a capacitor voltage, the first discharging path is turned on to discharge the output terminal of the bootstrap circuit, and the first high voltage providing path is turned off, and in response to a low voltage level inputted into the input terminal of the bootstrap circuit, the first charging path and the third charging path and the first discharging path are turned off, the first high voltage providing path is turned on, and a first superimposed voltage including the high voltage level and the capacitor voltage is provided to the output terminal of the bootstrap circuit.

2. The bootstrap circuit as claimed in claim 1, wherein in response to the high voltage level inputted into the input terminal of the bootstrap circuit, the voltage at the inverting input terminal of the bootstrap circuit is at the low voltage level, the second charging path and the second discharging path are turned off, the second high voltage providing path is turned on, and a second superimposed voltage including the high voltage level and the capacitor voltage is provided to the inverting output terminal of the bootstrap circuit, and in response to the low voltage level inputted into the input terminal of the bootstrap circuit, the voltage at the inverting input terminal of the bootstrap circuit is at the high voltage level, the second charging path is turned on, the second bootstrap capacitor is charged to the capacitor voltage, the second discharging path is turned on to discharge the inverting output terminal of the bootstrap circuit, and the second high voltage providing path is turned off.

3. The bootstrap circuit as claimed in claim 2, wherein the first superimposed voltage is equal to the second superimposed voltage.

4. The bootstrap circuit as claimed in claim 2, further comprising a discharging path providing circuit, wherein the discharging path providing circuit comprises:

a third discharging path, electrically connected between the ground terminal and the output terminal of the bootstrap circuit, wherein when the voltage at the inverting output terminal of the bootstrap circuit is equal to the second superimposed voltage, the third discharging path is turned on, and the output terminal of the bootstrap circuit is discharged to the ground terminal through the third discharging path; and a fourth discharging path, electrically connected between the ground terminal and the inverting output terminal of the bootstrap circuit, wherein when the voltage at the output terminal of the bootstrap circuit is equal to the first superimposed voltage, the fourth discharging path is turned on, and the inverting output terminal of the bootstrap circuit is discharged to the ground terminal through the fourth discharging path.

5. The bootstrap circuit as claimed in claim 1, wherein the charging path providing circuit further comprises a fourth charging path, the fourth charging path is electrically connected between the power voltage and the second end of the second bootstrap capacitor, and the fourth charging path is controlled according to the voltage at the output terminal of the bootstrap circuit, wherein in response to the low voltage level inputted into the input terminal of the bootstrap circuit, the voltage at the inverting input terminal of the bootstrap circuit is at the high voltage level, the second charging path and the fourth charging path are turned on, the second bootstrap capacitor is charged to the capacitor voltage, the second discharging path is turned on to discharge the inverting output terminal of the bootstrap circuit, and the second high voltage providing path is turned off, and in response to the high voltage level inputted into the input terminal of the bootstrap circuit, the voltage at the inverting input terminal of the bootstrap circuit is at the low voltage level, the second charging path and the second discharging path and the fourth charging path are turned off, the second high voltage providing path is turned on, and a second superimposed voltage including the high voltage level and the capacitor voltage is provided to the inverting output terminal of the bootstrap circuit.

6. The bootstrap circuit as claimed in claim 5, further comprising a level shifter circuit, wherein the level shifter circuit comprises:

a first resistor, having a first end electrically connected with the power voltage and a second end electrically connected with the fourth charging path; and a first level shifter capacitor, having a first end electrically connected with the second end of the first resistor, and a second end electrically connected with the output terminal of the bootstrap circuit, for charging by the power voltage through the first resistor to have a first level shift voltage, wherein the fourth charging path is controlled according to the voltage at the output terminal of the bootstrap circuit and the first level shift voltage.

7. The bootstrap circuit as claimed in claim 5, further comprising a level shifter circuit, wherein the level shifter circuit comprises:
   a second resistor, having a first end electrically connected with the power voltage and a second end electrically connected with the third charging path; and
   a second level shifter capacitor, having a first end electrically connected with the second end of the second resistor, and a second end electrically connected with the inverting output terminal of the bootstrap circuit, for charging by the power voltage through the second resistor to have a second level shift voltage, wherein the third charging path is controlled according to the voltage at the inverting output terminal of the bootstrap circuit and the second level shift voltage.

8. The bootstrap circuit as claimed in claim 5, further comprising a discharging path providing circuit, comprises:
   a third discharging path, electrically connected between the ground terminal and the output terminal of the bootstrap circuit, and controlled according to the voltage at the inverting output terminal of the bootstrap circuit, wherein when the third discharging path is turned on, the output terminal of the bootstrap circuit is discharged to the ground terminal through the third discharging path; and
   a fourth discharging path, electrically connected between the ground terminal and the inverting output terminal of the bootstrap circuit, and controlled according to the voltage at the output terminal of the bootstrap circuit, wherein when the fourth discharging path is turned on, the inverting output terminal of the bootstrap circuit is discharged to the ground terminal through the fourth discharging path.

9. The bootstrap circuit as claimed in claim 8, wherein when the voltage at the inverting output terminal of the bootstrap circuit is equal to the second superimposed voltage including the high voltage level and the capacitor voltage, the third discharging path is turned on, and when the voltage at the output terminal of the bootstrap circuit is equal to the first superimposed voltage including the high voltage level and the capacitor voltage, the fourth discharging path is turned on.

10. The bootstrap circuit as claimed in claim 5, further comprising a level shifter circuit, comprises:
    a first resistor, having a first end electrically connected with the power voltage and a second end electrically connected with the fourth charging path;
    a first level shifter capacitor, having a first end electrically connected with the second end of the first resistor and a second end electrically connected with the output terminal of the bootstrap circuit, wherein the first level shifter capacitor is charged by the power voltage through the first resistor, so that the first level shifter capacitor has a first level shift voltage, wherein the fourth charging path is controlled according to the voltage at the output terminal of the bootstrap circuit and the first level shift voltage;
    a second resistor, having a first end electrically connected with the power voltage and a second end electrically connected with the third charging path; and
    a second level shifter capacitor having a first end electrically connected with the second end of the second resistor and a second end electrically connected with the inverting output terminal of the bootstrap circuit, the second level shifter capacitor is charged by the power voltage through the second resistor to have a second level shift voltage, wherein the third charging path is controlled according to the voltage at the inverting output terminal of the bootstrap circuit and the second level shift voltage.

11. The bootstrap circuit as claimed in claim 1, further comprising a discharging path providing circuit with a third discharging path, electrically connected between the ground terminal and the output terminal of the bootstrap circuit, and the third discharging path is controlled according to the voltage at the inverting output terminal of the bootstrap circuit, wherein when the third discharging path is turned on, the output terminal of the bootstrap circuit is discharged to the ground terminal through the third discharging path.

12. The bootstrap circuit as claimed in claim 1, further comprising a discharging path providing circuit with a fourth discharging path, electrically connected between the ground terminal and the inverting output terminal of the bootstrap circuit, and the fourth discharging path is controlled according to the voltage at the output terminal of the bootstrap circuit, wherein when the voltage at the output terminal of the bootstrap circuit is equal to the first superimposed voltage, the fourth discharging path is turned on, and the inverting output terminal of the bootstrap circuit is discharged to the ground terminal through the fourth discharging path.

13. A bootstrap circuit with an input terminal, an inverting input terminal, an output terminal and an inverting output terminal, the bootstrap circuit comprising:
    a first sub-bootstrap circuit, comprising a first inverter, a first bootstrap capacitor, a first charging path, a first discharging path, and a first high voltage providing path, wherein an input terminal of the first inverter is electrically connected with the input terminal of the bootstrap circuit, an output terminal of the first inverter is electrically connected with a first end of the first bootstrap capacitor, the first charging path is electrically connected between a second end of the first bootstrap capacitor and a power voltage, the first high voltage providing path is electrically connected between the second end of the first bootstrap capacitor and the output terminal of the bootstrap circuit, and the first discharging path is electrically connected between the output terminal of the bootstrap circuit and a ground terminal, wherein the first discharging path and the first high voltage providing path are controlled according to a voltage at the input terminal of the bootstrap circuit, and the first charging path is controlled according to a voltage at the output terminal of the bootstrap circuit;
    a second sub-bootstrap circuit, comprising a second inverter, a second bootstrap capacitor, a second charging path, a second discharging path, and a second high voltage providing path, wherein an input terminal of the second inverter is electrically connected with the inverting input terminal of the bootstrap circuit, an output terminal of the second inverter is electrically connected with a first end of the second bootstrap capacitor, the second charging path is electrically connected between a second end of the second bootstrap capacitor and the power voltage, the second high voltage providing path is electrically connected between the second end of the second bootstrap capacitor and the inverting output terminal of the bootstrap circuit, and the second discharging path is electrically connected between the inverting output terminal of the bootstrap circuit and the ground terminal, wherein the second discharging path and the second high voltage providing path are controlled according to a voltage at the inverting input terminal of the bootstrap circuit, and the second charging path is controlled according to a voltage at the inverting output terminal of the bootstrap circuit; and a charging path providing circuit, comprising a fourth charging path, wherein the fourth charging path is electrically connected between the power voltage and the second end of the second bootstrap capacitor, and the fourth charging path is controlled according to the voltage at the output terminal of the bootstrap circuit, wherein in response to a high voltage level inputted into the inverting input terminal of the bootstrap circuit, the second charging path and the fourth charging path are turned on, the second bootstrap capacitor is charged to a capacitor voltage, the second discharging path is turned on to discharge the inverting output terminal of the bootstrap circuit, and the second high voltage providing path is turned off, and in response to a low voltage level inputted into the inverting input terminal of the bootstrap circuit, the second charging path, the fourth charging path and the second discharging path are turned off, the second high voltage providing path is turned on, and a second superimposed voltage including the high voltage level and the capacitor voltage is provided to the inverting output terminal of the bootstrap circuit.

14. The bootstrap circuit as claimed in claim 13, further comprising a discharging path providing circuit, wherein the discharging path providing circuit comprises:

a third discharging path, electrically connected between the ground terminal and the output terminal of the bootstrap circuit, and controlled according to the voltage at the inverting output terminal of the bootstrap circuit, wherein when the third discharging path is turned on, the output terminal of the bootstrap circuit is discharged to the ground terminal through the third discharging path; and a fourth discharging path, electrically connected between the ground terminal and the inverting output terminal of the bootstrap circuit, and controlled according to the voltage at the output terminal of the bootstrap circuit, wherein when the fourth discharging path is turned on, the inverting output terminal of the bootstrap circuit is discharged to the ground terminal through the fourth discharging path.

15. The bootstrap circuit as claimed in claim 14, wherein when the voltage at the inverting output terminal of the bootstrap circuit is equal to the second superimposed voltage with the high voltage level and the capacitor voltage, the third discharging path is turned on, and when the voltage at the output terminal of the bootstrap circuit is equal to a first superimposed voltage including the high voltage level and the capacitor voltage, the fourth discharging path is turned on.

16. The bootstrap circuit as claimed in claim 13, further comprising a level shifter circuit, wherein the level shifter circuit comprises:

a first resistor, having a first end electrically connected with the power voltage and a second end electrically connected with the fourth charging path; and a first level shifter capacitor, having a first end electrically connected with the second end of the first resistor and a second end electrically connected with the output terminal of the bootstrap circuit, the first level shifter capacitor is charged by the power voltage through the first resistor, to have a first level shift voltage, wherein the fourth charging path is controlled according to the voltage at the output terminal of the bootstrap circuit and the first level shift voltage.

17. A bootstrap circuit with an input terminal, an inverting input terminal, an output terminal and an inverting output terminal, the bootstrap circuit comprising:

a first sub-bootstrap circuit, comprising a first inverter, a first bootstrap capacitor, a first charging path, a first discharging path, and a first high voltage providing path, wherein an input terminal of the first inverter is electrically connected with the input terminal of the bootstrap circuit, an output terminal of the first inverter is electrically connected with a first end of the first bootstrap capacitor, the first charging path is electrically connected between a second end of the first bootstrap capacitor and a power voltage, the first high voltage providing path is electrically connected between the second end of the first bootstrap capacitor and the output terminal of the bootstrap circuit, and the first discharging path is electrically connected between the output terminal of the bootstrap circuit and a ground terminal;

a second sub-bootstrap circuit, comprising a second inverter, a second bootstrap capacitor, a second charging path, a second discharging path, and a second high voltage providing path, wherein an input terminal of the second inverter is electrically connected with the inverting input terminal of the bootstrap circuit, an output terminal of the second inverter is electrically connected with a first end of the second bootstrap capacitor, the second charging path is electrically connected between a second end of the second bootstrap capacitor and the power voltage, the second high voltage providing path is electrically connected between the second end of the second bootstrap capacitor and the inverting output terminal of the bootstrap circuit, and the second discharging path is electrically connected between the inverting output terminal of the bootstrap circuit and the ground terminal; and a discharging path providing circuit, comprising a third discharging path, wherein the third discharging path is electrically connected between the ground terminal and the output terminal of the bootstrap circuit, wherein the third discharging path is controlled according to the voltage at the inverting output terminal of the bootstrap circuit;

wherein the first discharging path and the first high voltage providing path are controlled according to a voltage at the input terminal of the bootstrap circuit, and the first charging path is controlled according to a voltage at the output terminal of the bootstrap circuit, the second discharging path and the second high voltage providing path are controlled according to a voltage at the inverting input terminal of the bootstrap circuit, and the second charging path is controlled according to a voltage at the inverting output terminal of the bootstrap circuit, and the third discharging path is turned on, the output terminal of the bootstrap circuit is discharged to the ground terminal through the third discharging path.

18. The bootstrap circuit as claimed in claim 17, wherein the discharging path providing circuit further comprises a fourth discharging path, electrically connected between the ground terminal and the inverting output terminal of the bootstrap circuit, and controlled according to the voltage at the output terminal of the bootstrap circuit, wherein when the fourth discharging path is turned on, the inverting output terminal of the bootstrap circuit is discharged to the ground terminal through the fourth discharging path.

19. The bootstrap circuit as claimed in claim 17, further comprising a charging path providing circuit, wherein the charging path providing circuit comprises a fourth charging path which is electrically connected between the power voltage and the second end of the second bootstrap capacitor, and the fourth charging path is controlled according to the voltage at the output terminal of the bootstrap circuit, wherein in response to the low voltage level inputted into the input terminal of the bootstrap circuit, the voltage at the inverting input terminal of the bootstrap circuit is at the high voltage level, the second charging path and the fourth charging path are turned on, the second bootstrap capacitor is charged to the capacitor voltage, the second discharging path is turned on to discharge the inverting output terminal of the bootstrap circuit, and the second high voltage providing path is turned off, and in response to the high voltage level inputted into the input terminal of the bootstrap circuit, the voltage at the inverting input terminal of the bootstrap circuit is at the low voltage level, the second charging path, the second discharging path, and the fourth charging path are turned off, the second high voltage providing path is turned on, and a second superimposed voltage including the high voltage level and the capacitor voltage is provided to the inverting output terminal of the bootstrap circuit.

20. The bootstrap circuit as claimed in claim 19, further comprising a level shifter circuit, wherein the level shifter circuit comprises:
  a first resistor, having a first end electrically connected with the power voltage and a second end electrically connected with the fourth charging path; and
  a first level shifter capacitor, having a first end electrically connected with the second end of the first resistor and a second end electrically connected with the output terminal of the bootstrap circuit, the first level shifter capacitor is charged by the power voltage through the first resistor, so that the first level shifter capacitor has a first level shift voltage, wherein the fourth charging path is controlled according to the voltage at the output terminal of the bootstrap circuit and the first level shift voltage.

21. A bootstrap circuit with an input terminal, an inverting input terminal, an output terminal and an inverting output terminal, the bootstrap circuit comprising:
  a first sub-bootstrap circuit, comprising a first inverter, a first bootstrap capacitor, a first charging path, a first discharging path, and a first high voltage providing path, wherein an input terminal of the first inverter is electrically connected with the input terminal of the bootstrap circuit, an output terminal of the first inverter is electrically connected with a first end of the first bootstrap capacitor, the first charging path is electrically connected between a second end of the first bootstrap capacitor and a power voltage, the first high voltage providing path is electrically connected between the second end of the first bootstrap capacitor and the output terminal of the bootstrap circuit, and the first discharging path is electrically connected between the output terminal of the bootstrap circuit and a ground terminal;
  a second sub-bootstrap circuit, comprising a second inverter, a second bootstrap capacitor, a second charging path, a second discharging path, and a second high voltage providing path, wherein an input terminal of the second inverter is electrically connected with the inverting input terminal of the bootstrap circuit, an output terminal of the second inverter is electrically connected with a first end of the second bootstrap capacitor, the second charging path is electrically connected between a second end of the second bootstrap capacitor and the power voltage, the second high voltage providing path is electrically connected between the second end of the second bootstrap capacitor and the inverting output terminal of the bootstrap circuit, and the second discharging path is electrically connected between the inverting output terminal of the bootstrap circuit and the ground terminal; and
  a discharging path providing circuit, comprising a fourth discharging path, wherein the fourth discharging path is electrically connected between the ground terminal and the inverting output terminal of the bootstrap circuit, wherein when the voltage at the output terminal of the bootstrap circuit is equal to a first superimposed voltage, the fourth discharging path is turned on, and the inverting output terminal of the bootstrap circuit is discharged to the ground terminal through the fourth discharging path;
  wherein, wherein the first discharging path and the first high voltage providing path are controlled according to a voltage at the input terminal of the bootstrap circuit, and the first charging path is controlled according to a voltage at the output terminal of the bootstrap circuit, wherein the second discharging path and the second high voltage providing path are controlled according to a voltage at the inverting input terminal of the bootstrap circuit, and the second charging path is controlled according to a voltage at the inverting output terminal of the bootstrap circuit.

22. The bootstrap circuit as claimed in claim 21, further comprising a charging path providing circuit with a fourth charging path, the fourth charging path is electrically connected between the power voltage and the second end of the second bootstrap capacitor, and the fourth charging path is controlled according to the voltage at the output terminal of the bootstrap circuit, wherein in response to the low voltage level inputted into the input terminal of the bootstrap circuit, the voltage at the inverting input terminal of the bootstrap circuit is at the high voltage level, the second charging path and the fourth charging path are turned on, the second bootstrap capacitor is charged to the capacitor voltage, the second discharging path is turned on to discharge the inverting output terminal of the bootstrap circuit, and the second high voltage providing path is turned off, and in response to the high voltage level inputted into the input terminal of the bootstrap circuit, the voltage at the inverting input terminal of the bootstrap circuit is at the low voltage level, the second charging path, the second discharging path and the fourth charging path are turned off, the second high voltage providing path is turned on, and a second superimposed voltage including the high voltage level and the capacitor voltage is provided to the inverting output terminal of the bootstrap circuit.

23. The bootstrap circuit as claimed in claim 22, further comprising a level shifter circuit, comprises:
  a first resistor, having a first end electrically connected with the power voltage and a second end electrically connected with the fourth charging path; and
  a first level shifter capacitor, having a first end electrically connected with the second end of the first resistor and a second end electrically connected with the output terminal of the bootstrap circuit, for charging by the power voltage through the first resistor to have a first level shift voltage, wherein the fourth charging path is controlled according to the voltage at the output terminal of the bootstrap circuit and the first level shift voltage.

* * * * *